(12) United States Patent
Liang et al.

(10) Patent No.: US 9,324,864 B2
(45) Date of Patent: Apr. 26, 2016

(54) SEMICONDUCTOR DEVICE STRUCTURE AND METHOD FOR FORMING THE SAME

(71) Applicant: Taiwan Semiconductor Manufacturing Co., Ltd., Hsin-Chu (TW)

(72) Inventors: Chia-Yao Liang, Tainan (TW); Chen-Liang Liao, Taichung (TW); Ming Lei, Taichung (TW); Chih-Hsiao Chen, Taichung (TW); Yi-Lii Huang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/502,430

(22) Filed: Sep. 30, 2014

(65) Prior Publication Data

US 2016/0093736 A1    Mar. 31, 2016

(51) Int. Cl.
*H01L 29/76* (2006.01)
*H01L 29/78* (2006.01)
*H01L 29/45* (2006.01)
*H01L 29/06* (2006.01)
*H01L 27/088* (2006.01)
*H01L 29/66* (2006.01)
*H01L 21/8234* (2006.01)

(52) U.S. Cl.
CPC .... *H01L 29/7848* (2013.01); *H01L 21/823418* (2013.01); *H01L 21/823475* (2013.01); *H01L 21/823481* (2013.01); *H01L 27/088* (2013.01); *H01L 29/0653* (2013.01); *H01L 29/45* (2013.01); *H01L 29/665* (2013.01); *H01L 29/66545* (2013.01); *H01L 29/66636* (2013.01)

(58) Field of Classification Search
CPC ............... H01L 21/76224; H01L 29/7848; H01L 29/6653; H01L 29/66628; H01L 29/66636; H01L 29/6656
USPC ................... 257/288, 295, E21.409
See application file for complete search history.

(56) References Cited

U.S. PATENT DOCUMENTS

| 7,663,237 | B2  | 2/2010 | Peng et al. |     |
|-----------|-----|--------|-------------|-----|
| 8,536,619 | B2* | 9/2013 | Kuan et al. | 257/192 |
| 8,648,446 | B2  | 2/2014 | Chang et al. |    |
| 2013/0240956 | A1* | 9/2013 | Hou et al. | 257/288 |

* cited by examiner

*Primary Examiner* — Tan N Tran
(74) *Attorney, Agent, or Firm* — Birch, Stewart, Kolasch & Birch, LLP

(57) ABSTRACT

A semiconductor device structure is provided. The semiconductor device structure includes a semiconductor substrate. The semiconductor device structure includes an isolation structure positioned in the semiconductor substrate and adjacent to a first active region of the semiconductor substrate. The semiconductor device structure includes a gate stack disposed over the first active region. The semiconductor device structure includes a first contact structure disposed over the first active region and positioned between the isolation structure and the gate stack. The semiconductor device structure includes a dummy gate stack disposed over the isolation structure and adjacent to the gate stack. The dummy gate stack is not positioned over a portion of the isolation structure next to the first contact structure.

20 Claims, 28 Drawing Sheets

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-2 to 1S-2 are cross-sectional views of various stages of a process for forming a semiconductor device structure along lines A-A' shown in FIGS. 1A-1 to 1S-1, in accordance with some embodiments.

FIG. 1C-3 is a cross-sectional view of a stage of a process for forming the structure along lines B-B' shown in FIG. 1C-1, in accordance with some embodiments.

FIG. 1H-3 is a cross-sectional view of a stage of a process for forming the structure along lines B-B' shown in FIG. 1H-1, in accordance with some embodiments.

FIG. 1S-3 is a cross-sectional view of a stage of a process for forming the structure along lines B-B' shown in FIG. 1S-1, in accordance with some embodiments.

FIGS. 2A-1 to 2D-1 are top views of various stages of a process for forming a semiconductor device structure, in accordance with some embodiments.

FIGS. 2A-2 to 2D-2 are cross-sectional views of various stages of a process for forming the semiconductor device structure along lines A-A' shown in FIGS. 2A-1 to 2D-1, in accordance with some embodiments.

FIG. 2C-3 to 2D-3 are cross-sectional views of various stages of a process for forming the semiconductor device structure along lines B-B' shown in FIGS. 2C-1 to 2D-1, in accordance with some embodiments.

DETAILED DESCRIPTION

Figures 1, 1A:
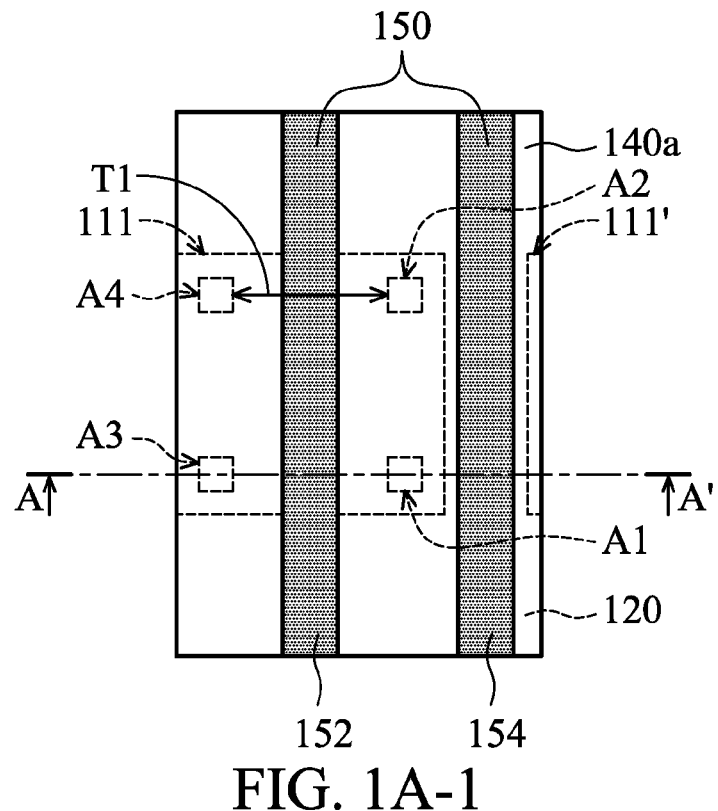
FIGS. 1A-1 to 1S-1 are top views of various stages of a process for forming a semiconductor device structure 300, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A, 2:
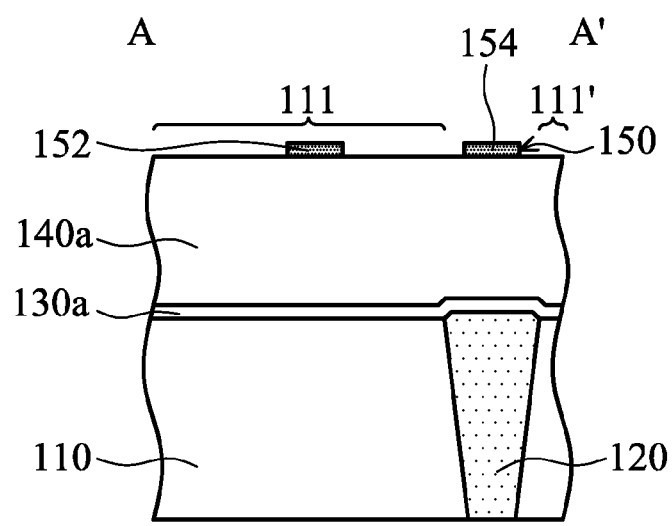
Figures 1, 1B:
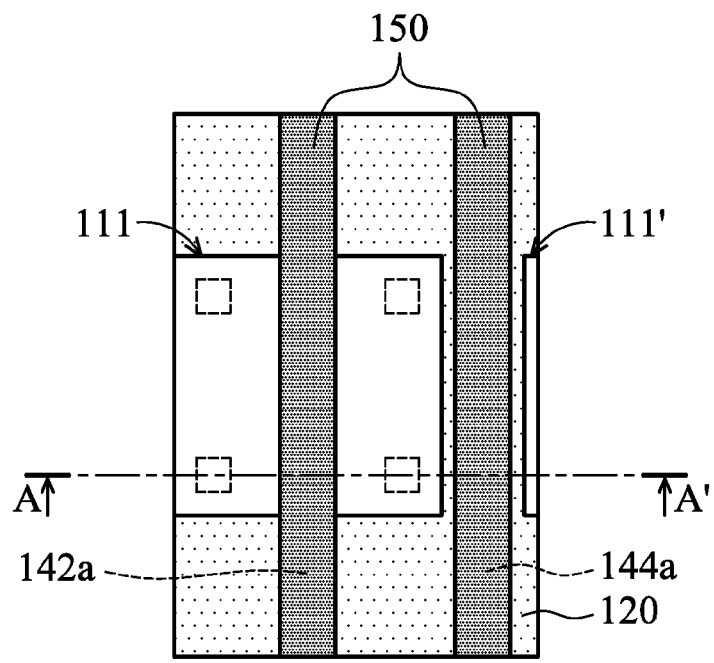
Figures 1, 1B, 2:
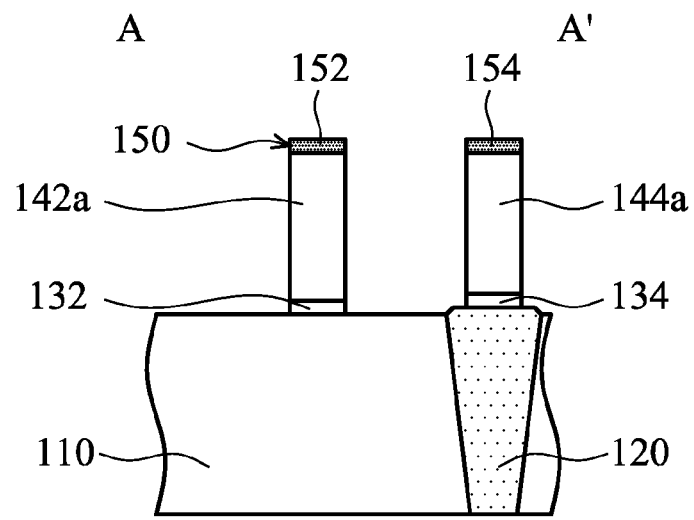
Figures 1, 1C:
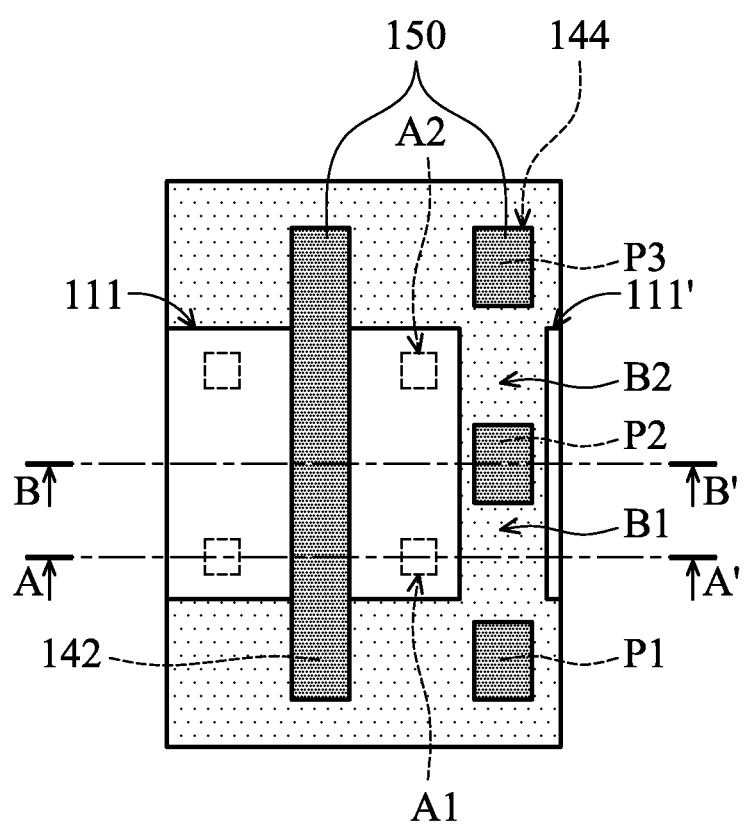
Figures 1, 1C, 2:
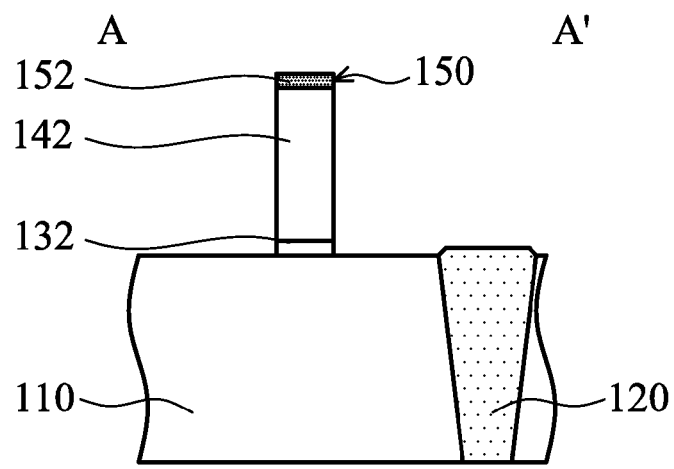
Figures 1, 1C, 2, 3:
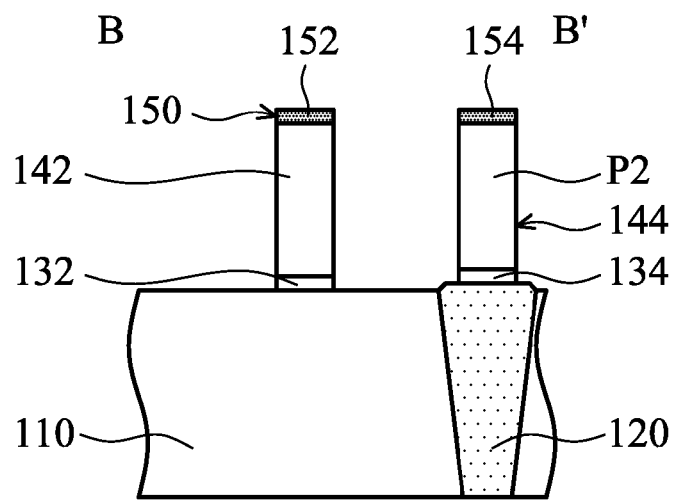
Figures 1, 1D:
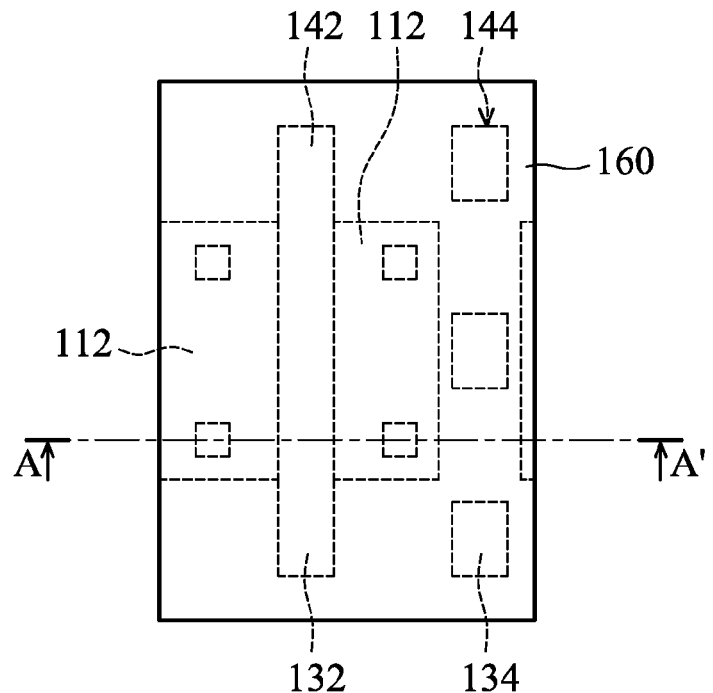
Figures 1, 1D, 2:
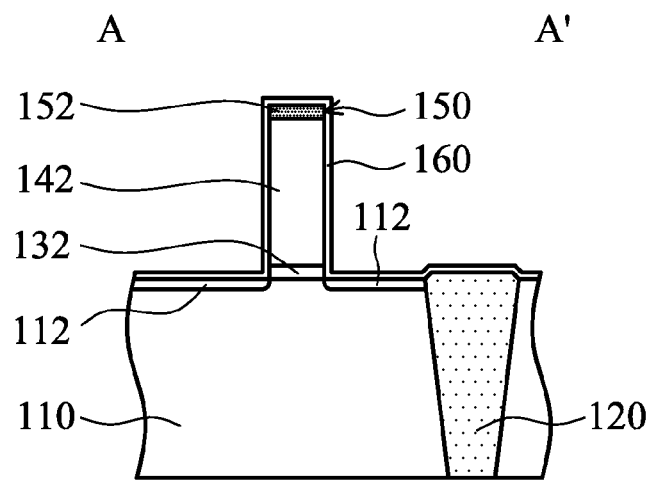
Figures 1, 1E:
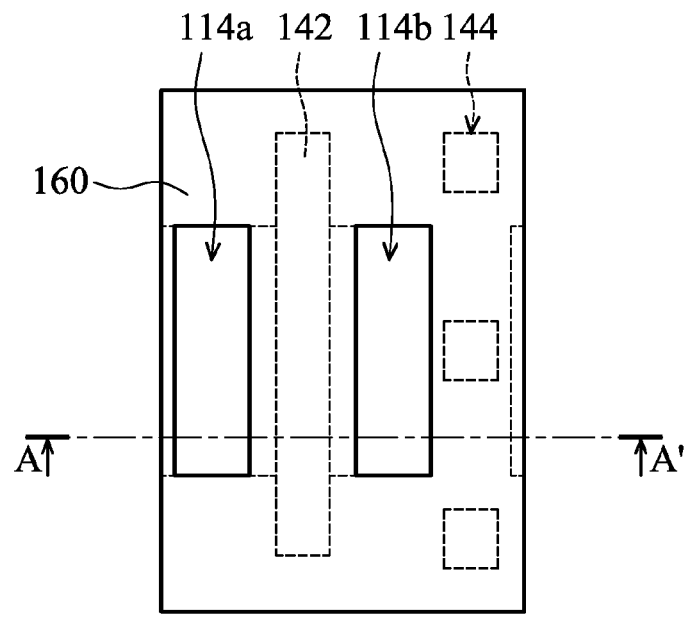
Figures 1, 1E, 2:
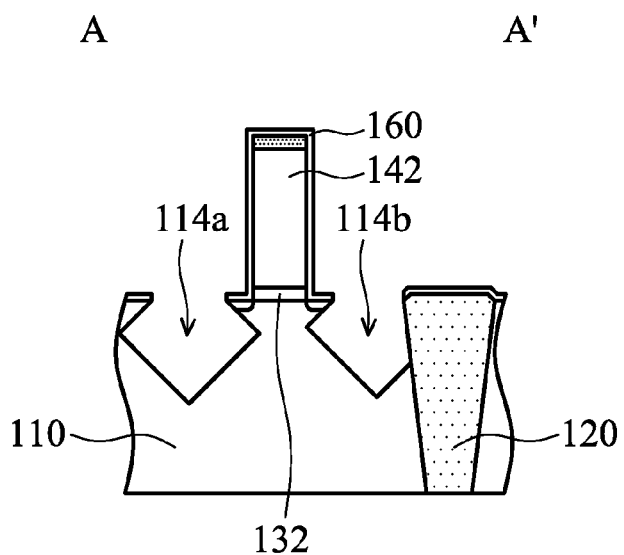
Figures 1, 1F:
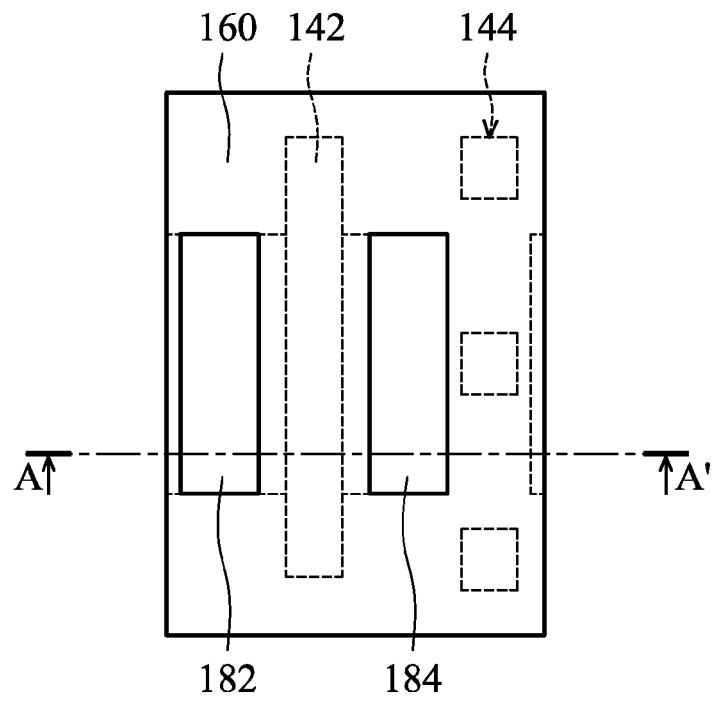
Figures 1, 1F, 2:
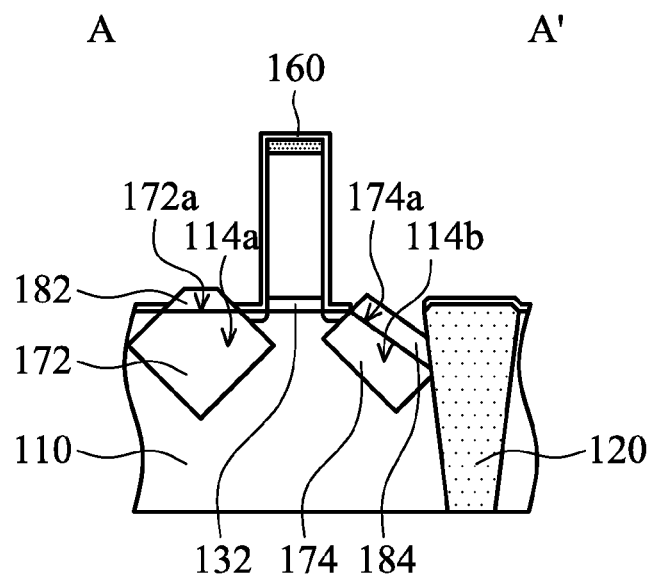
Figures 1, 1G:
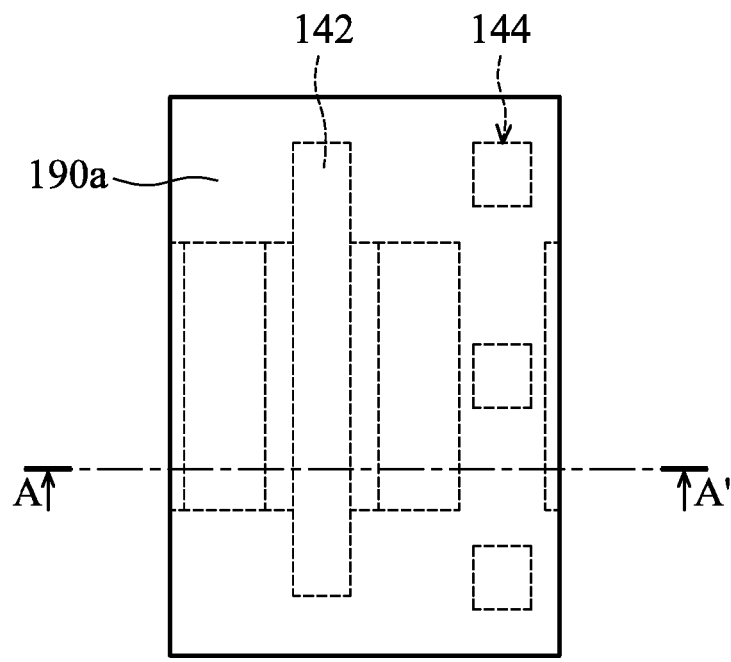
Figures 1, 1G, 2:
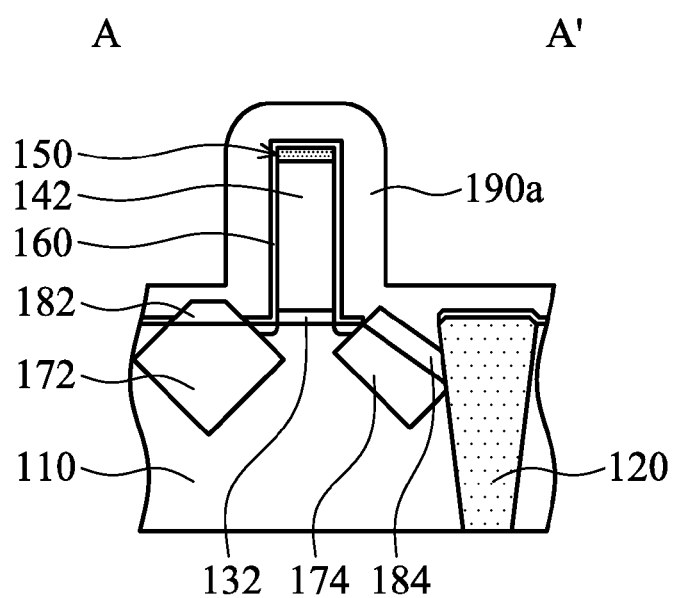
Figures 1, 1H:
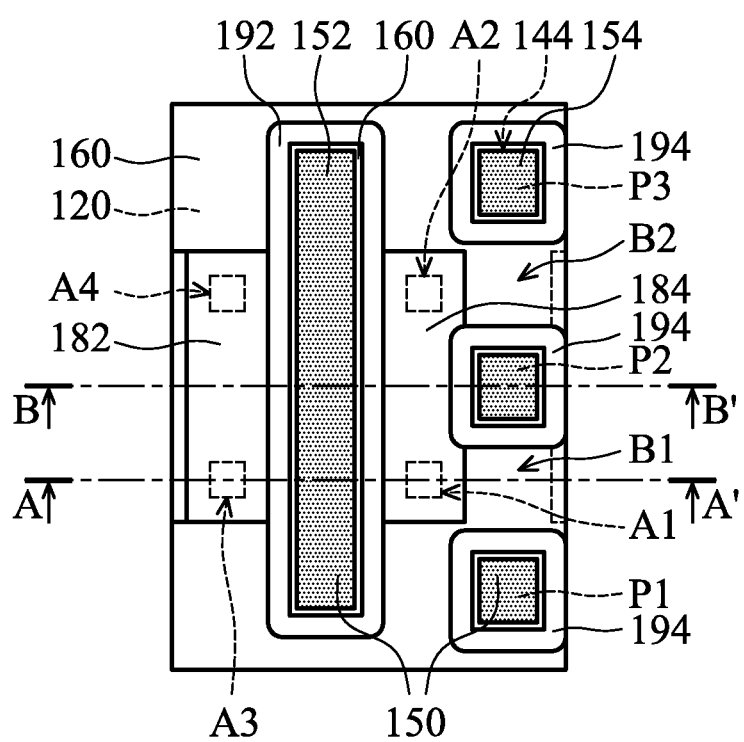
Figures 1, 1H, 2:
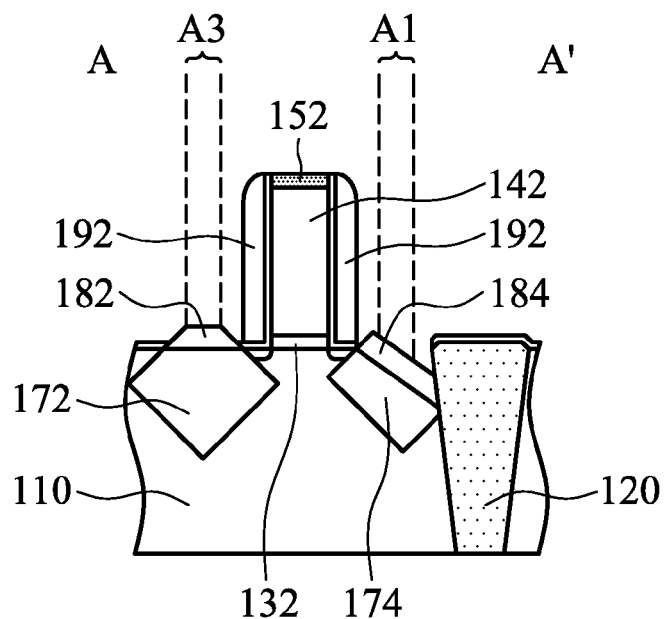
Figures 1, 1H, 2, 3:
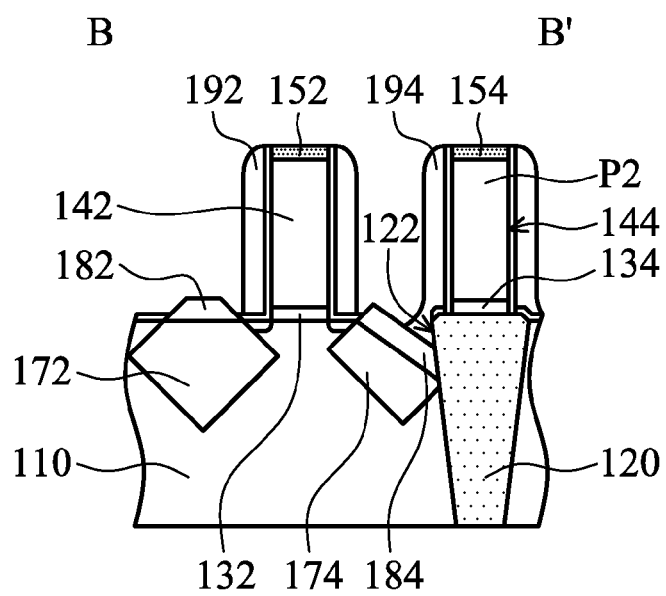
Figures 1, 1I:
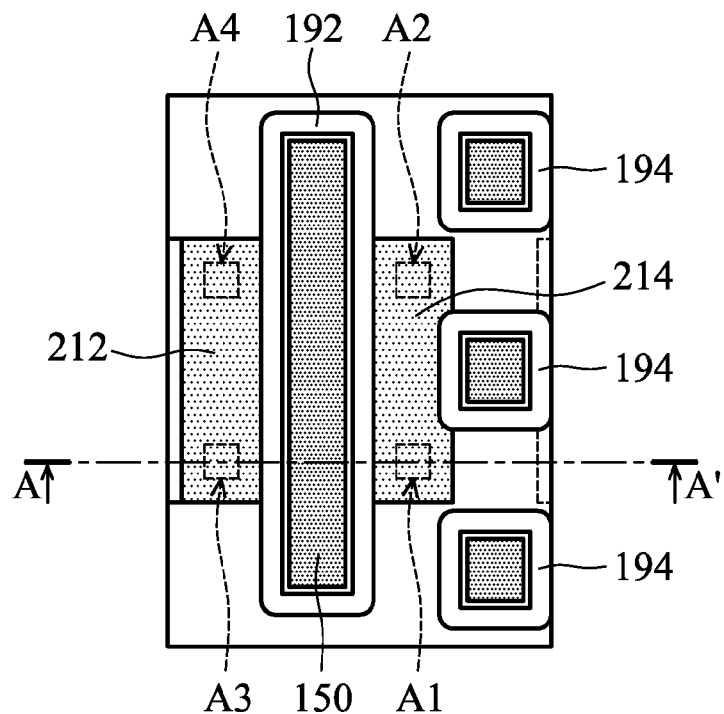
Figures 1, 1I, 2:
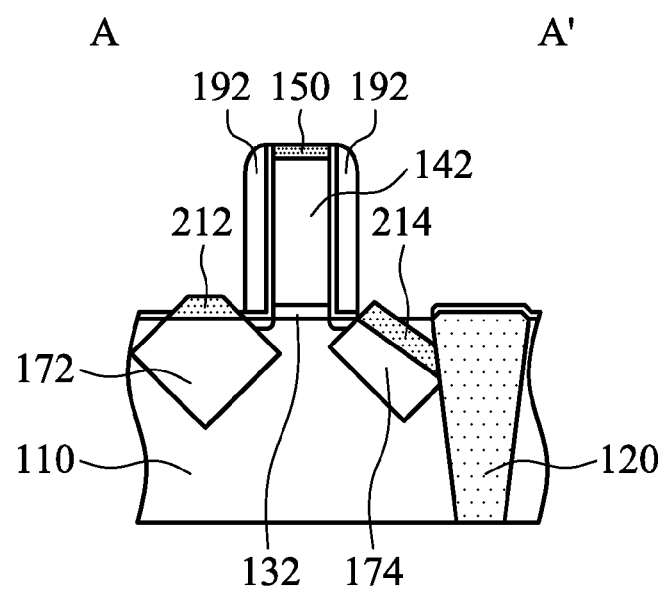
Figures 1, 1J:
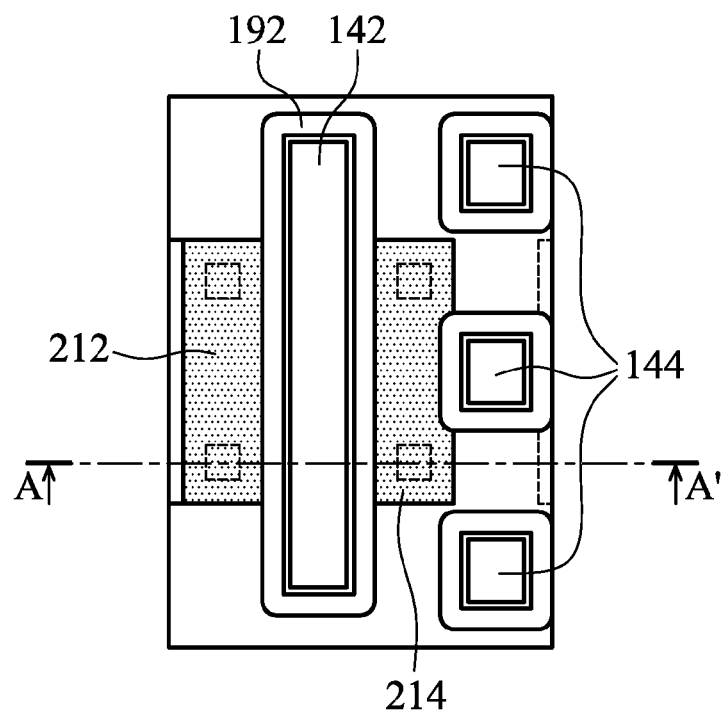
Figures 1, 1J, 2:
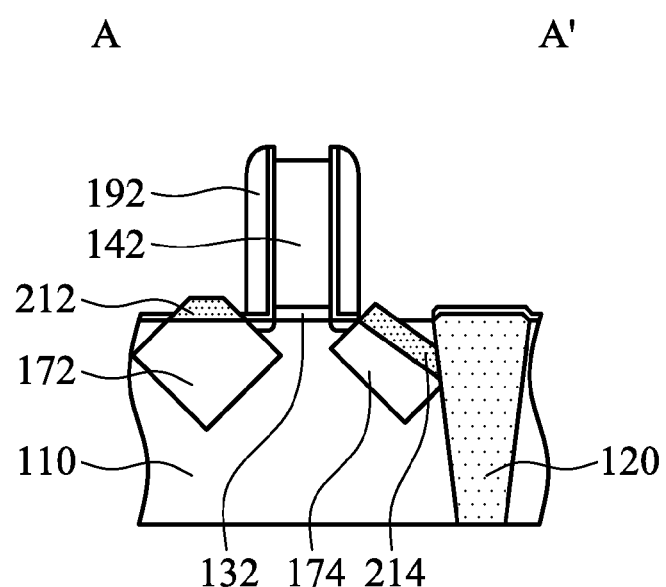
Figures 1, 1K:
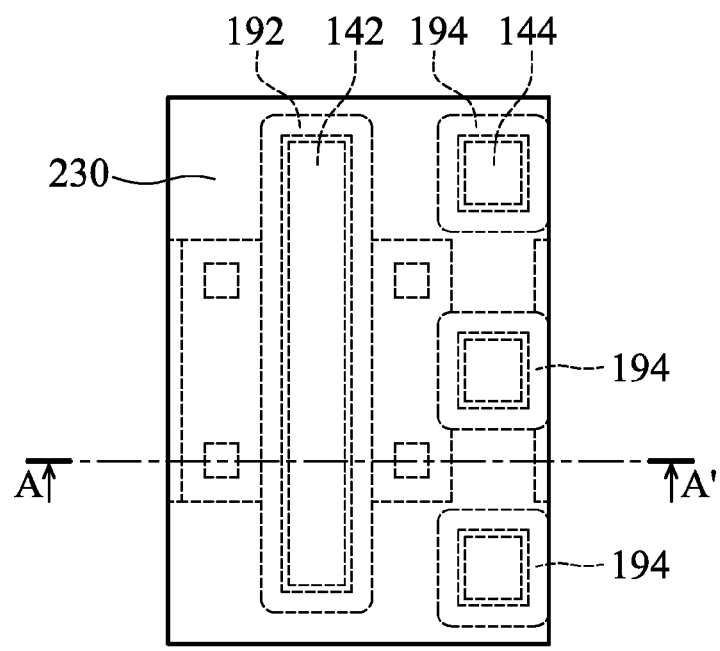
Figures 1, 1K, 2:
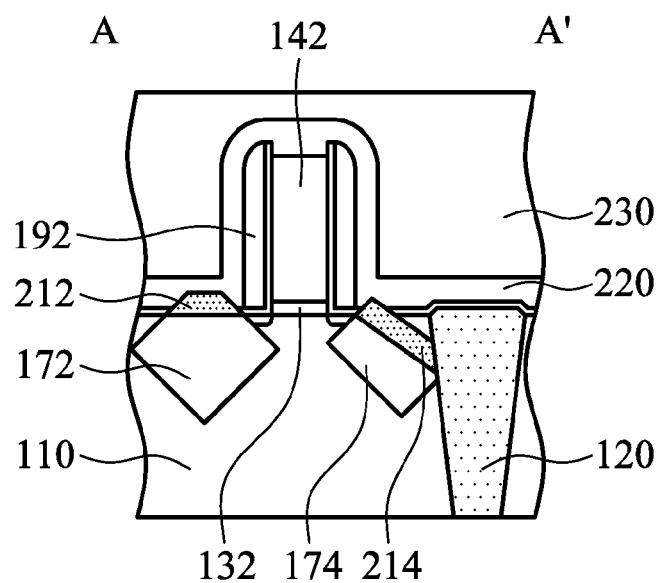
Figures 1, 1L:
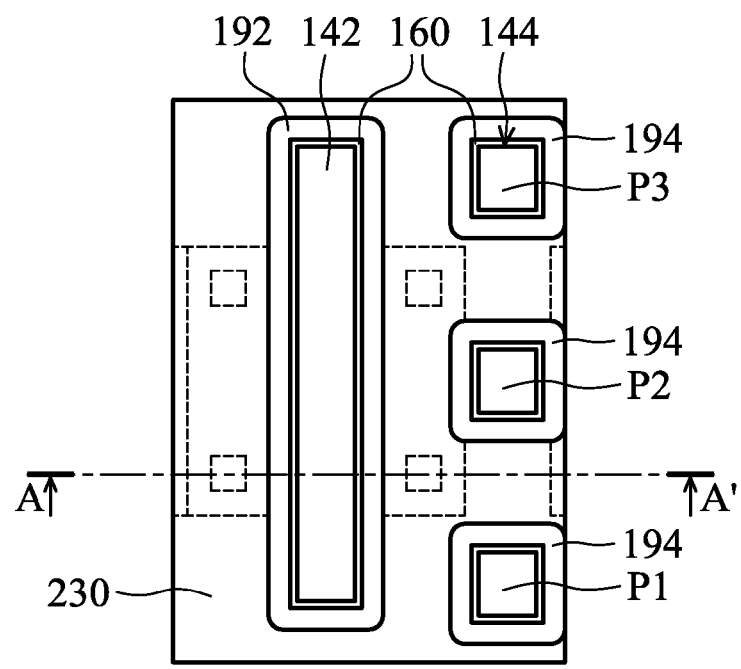
Figures 1, 1L, 2:
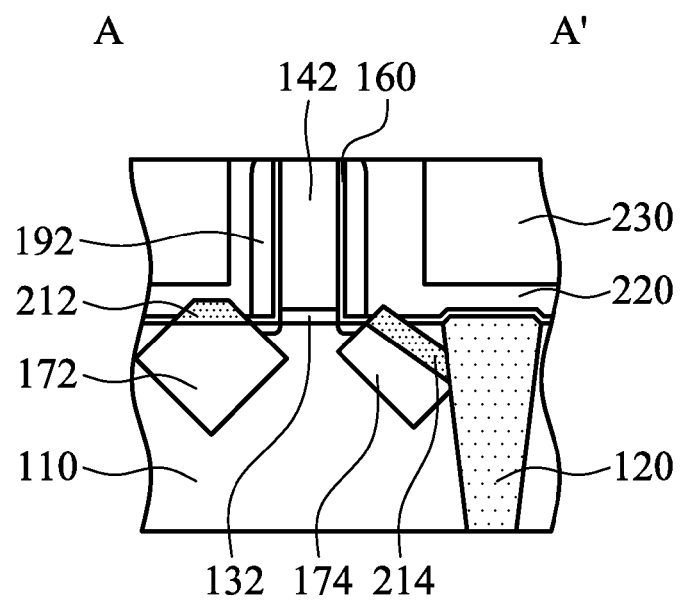
Figures 1, 1M:
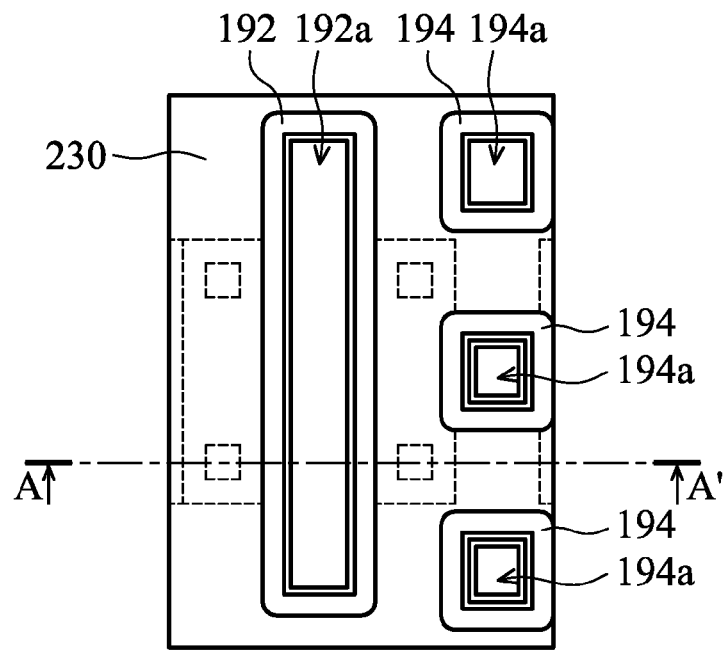
Figures 1, 1M, 2:
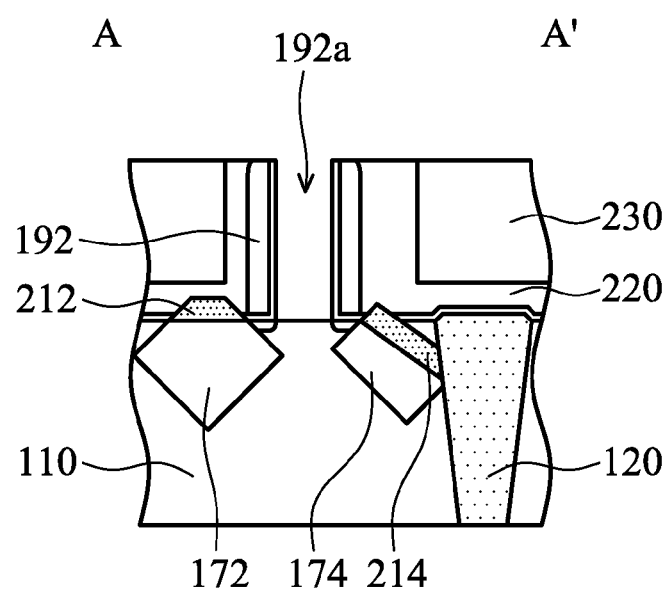
Figures 1, 1N:
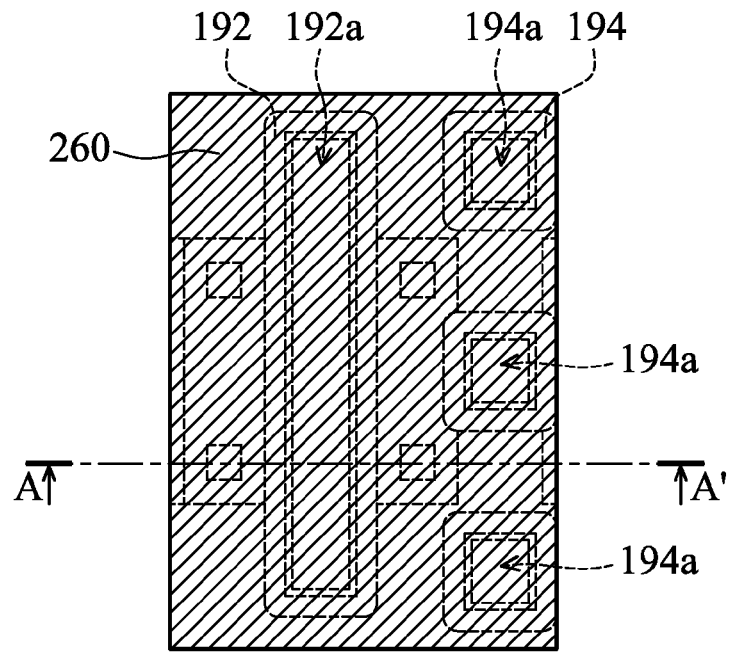
Figures 1, 1N, 2:
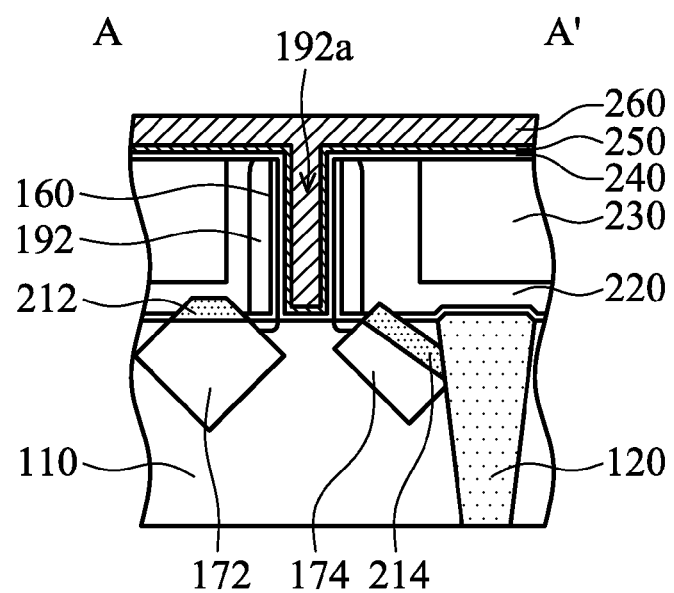
Figures 1, 1O:
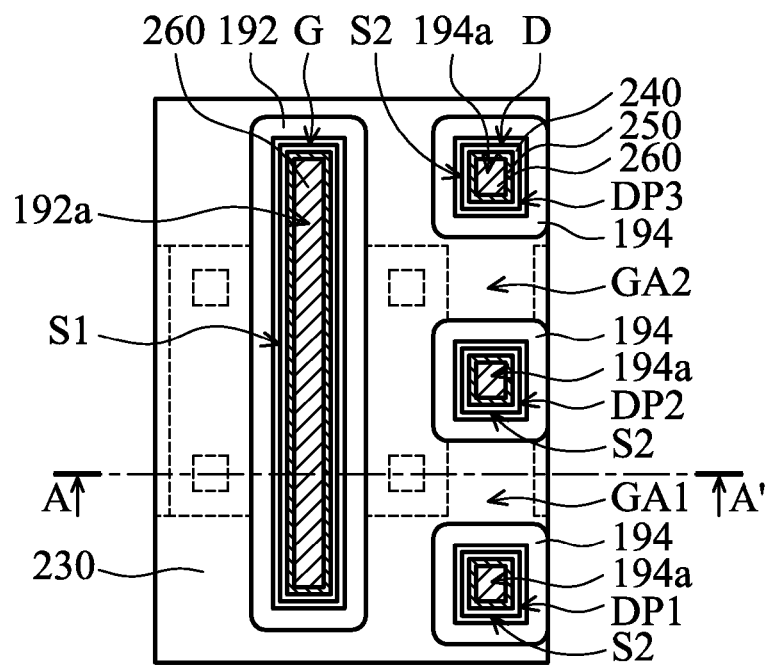
Figures 1, 1O, 2:
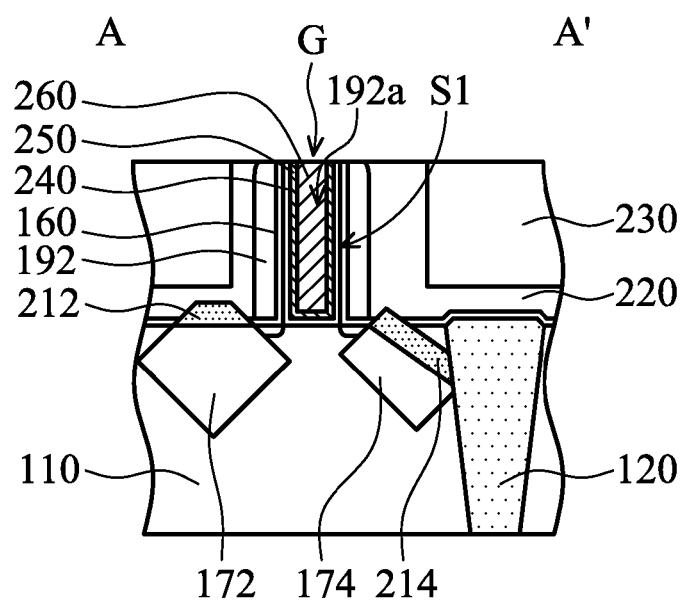
Figures 1, 1P:
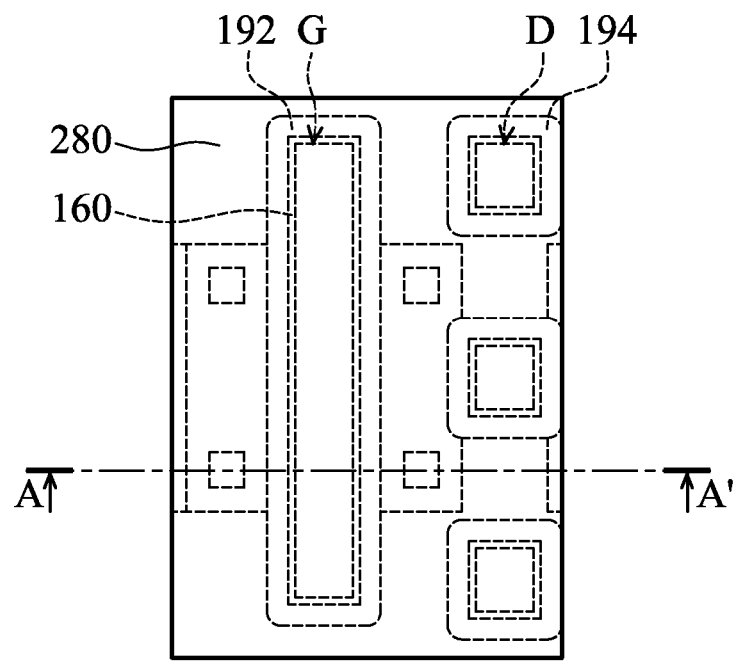
Figures 1, 1P, 2:
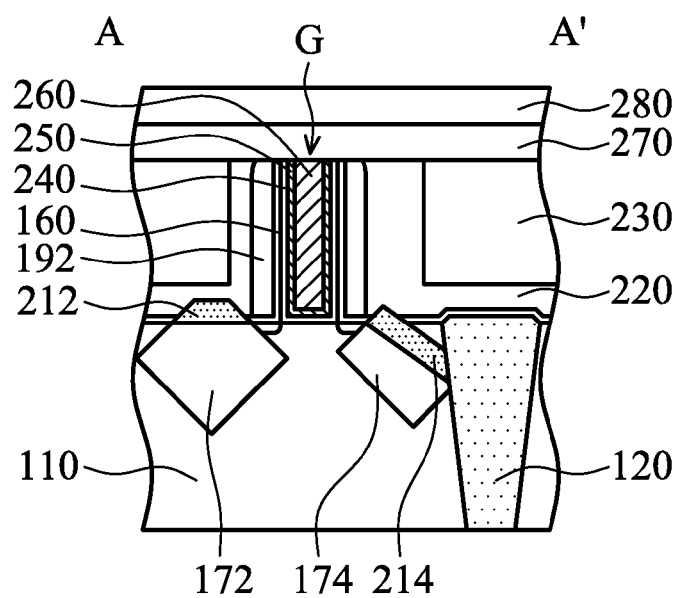
Figures 1, 1Q:
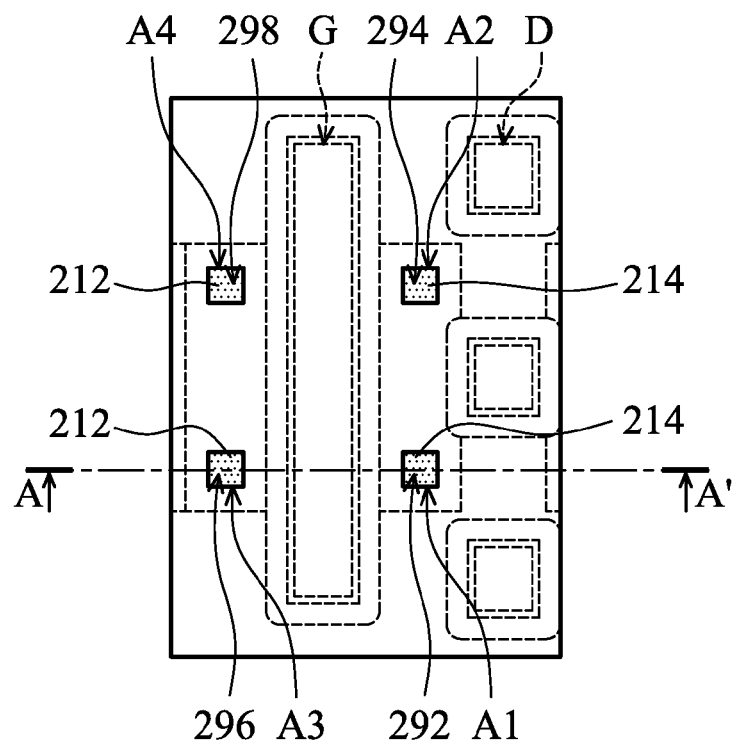
Figures 1, 1Q, 2:
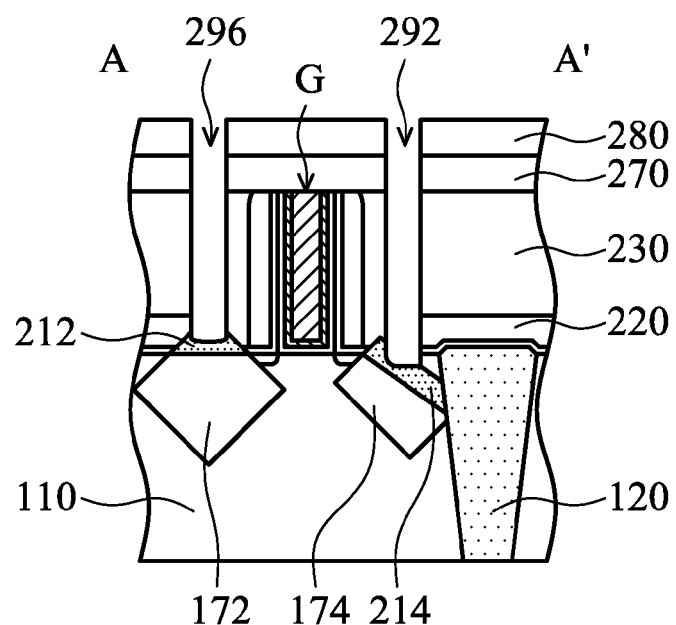
Figures 1, 1R:
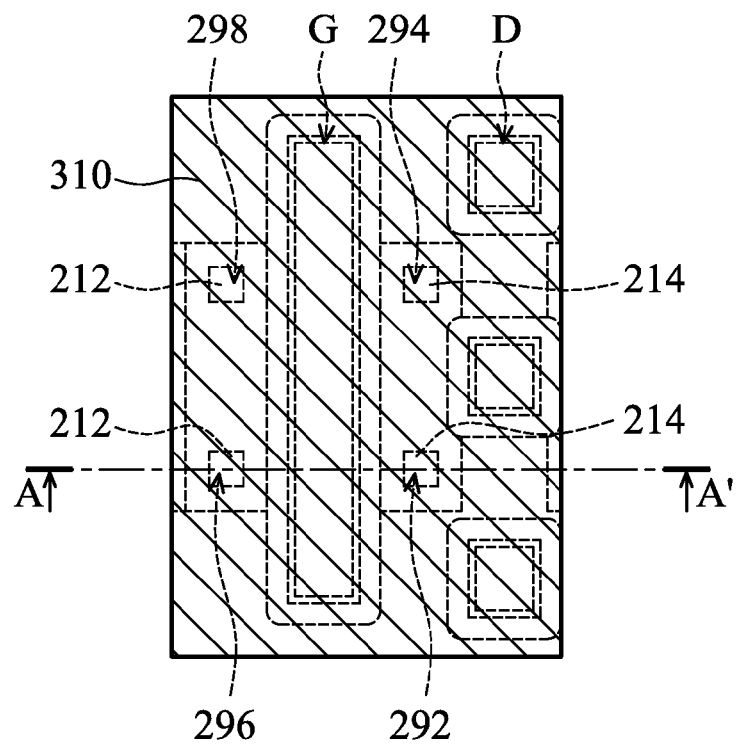
Figures 1, 1R, 2:
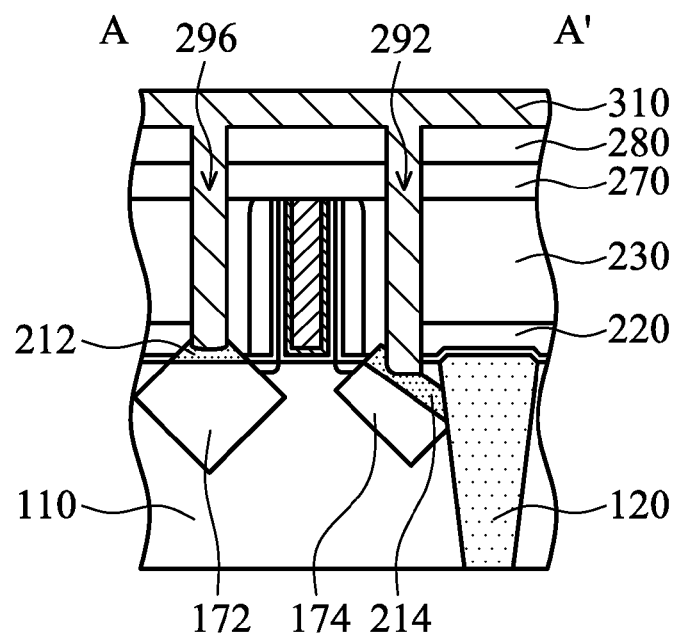
Figures 1, 1S:
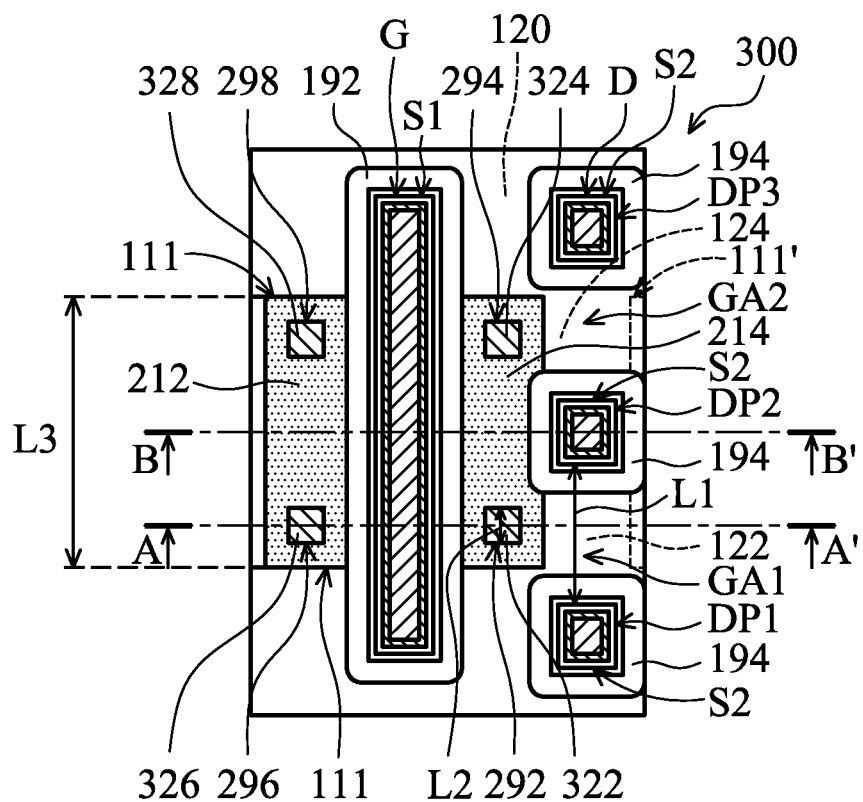
Figures 1, 1S, 2:
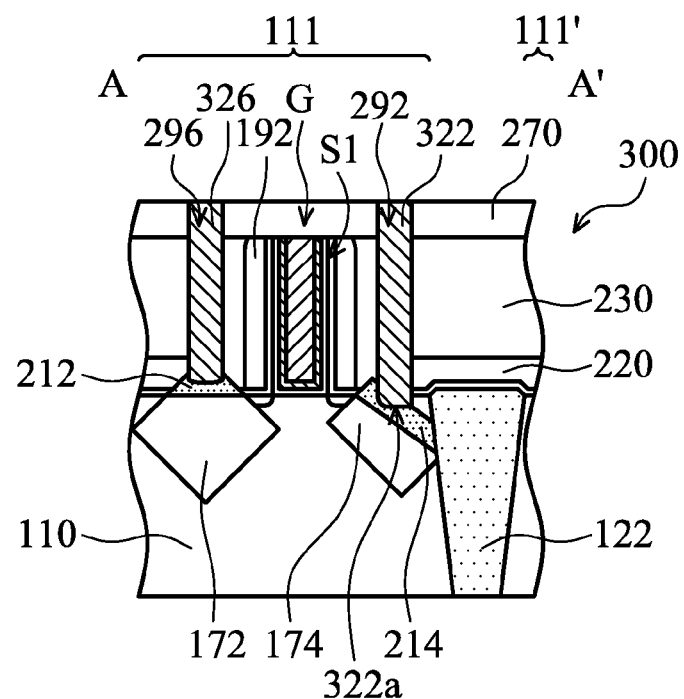
Figures 1, 1S, 2, 3:
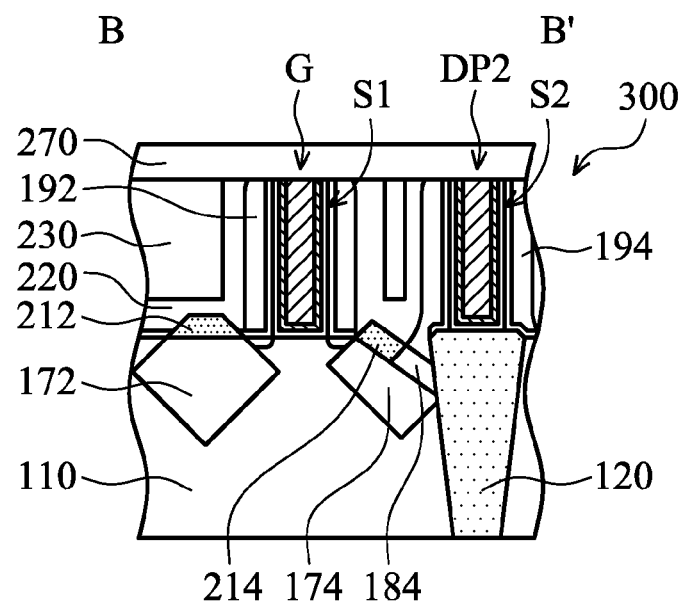

FIGS. 1A-1 to 1S-1 are top views of various stages of a process for forming a semiconductor device structure 300, in accordance with some embodiments. FIGS. 1A-2 to 1S-2 are cross-sectional views of various stages of a process for forming a semiconductor device structure along lines A-A' shown in FIGS. 1A-1 to 1S-1, in accordance with some embodiments.

As shown in FIGS. 1A-1 and 1A-2, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIGS. 1A-1 and 1A-2, an isolation structure 120 is formed in the semiconductor substrate 110, in accordance with some embodiments. The isolation structure 120 is adjacent to (or surrounds) active regions 111 and 111' of the semiconductor substrate 110, in accordance with some embodiments. The active region 111 has contact areas A1, A2, A3, and A4 where contact structures will be formed in subsequent processes, in accordance with some embodiments. A distance T1 between the contact areas A2 and A4 ranges from about 0.09 μm to about 18 μm, in accordance with some embodiments. The distance T1 between the contact areas A2 and A4 ranges from about 0.09 μm to about 3 μm, in accordance with some embodiments.

The active region 111' may have contact areas (not shown) similar to the contact areas A1, A2, A3, and A4. The isolation structure 120 is configured to define and electrically isolate various device elements (not shown) formed in the semiconductor substrate 110, in accordance with some embodiments.

Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The isolation structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process and an etching process to the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIGS. 1A-1 and 1A-2, a gate dielectric material layer 130a is deposited over the semiconductor substrate 110, in accordance with some embodiments. The gate dielectric material layer 130a is made of silicon oxide, in accordance with some embodiments. The gate dielectric material layer 130a is deposited using a chemical vapor deposition process (CVD process), in accordance with some embodiments.

As shown in FIGS. 1A-1 and 1A-2, a dummy gate material layer 140a is deposited over the gate dielectric material layer 130a, in accordance with some embodiments. The dummy gate material layer 140a is made of polysilicon, in accordance with some embodiments. The dummy gate material layer 140a is deposited using a chemical vapor deposition process, in accordance with some embodiments.

As shown in FIGS. 1A-1 and 1A-2, a mask layer 150 is formed over the dummy gate material layer 140a, in accordance with some embodiments. The mask layer 150 exposes a portion of the dummy gate material layer 140a, in accordance with some embodiments. The mask layer 150 includes a first portion 152 and a second portion 154 spaced apart from each other, in accordance with some embodiments.

The first portion 152 extends across the active region 111, and the second portion 154 is located over the isolation structure 120, in accordance with some embodiments. The first portion 152 and the second portion 154 are strip-shaped and are parallel to each other, in accordance with some embodiments. In some embodiments, the first portion 152 further extends across other active regions (not shown).

In some embodiments, the mask layer 150 includes oxide or nitride, such as silicon oxide, silicon oxynitride, silicon nitride, or the like. The mask layer 150 is formed by a depositing process (such as a chemical vapor deposition process), a photolithography process, and an etching process, in accordance with some embodiments.

As shown in FIGS. 1B-1 and 1B-2, the dummy gate material layer 140a exposed by the mask layer 150 is removed, and the gate dielectric material layer 130a under the removed dummy gate material layer 140a is also removed, in accordance with some embodiments.

The dummy gate material layer 140a remaining under the first portion 152 forms a dummy gate strip 142a, in accordance with some embodiments. The dummy gate strip 142a extends across the active region 111 and other active regions (not shown), in accordance with some embodiments. The dummy gate material layer 140a remaining under the second portion 154 forms a dummy gate strip 144a, in accordance with some embodiments.

The dummy gate strip 144a over the isolation structure 120 is configured to improve the uniformity of the distribution density of the dummy gate strips over the semiconductor substrate 110, which may improve the yield of the photolithography processes performed over the semiconductor substrate 110, in accordance with some embodiments.

The gate dielectric material layer 130a remaining under the dummy gate strip 142a forms a gate dielectric layer 132, in accordance with some embodiments. The gate dielectric material layer 130a remaining under the dummy gate strip 144a forms a gate dielectric layer 134, in accordance with some embodiments. The removal process includes a dry etching process, in accordance with some embodiments.

FIG. 1C-3 is a cross-sectional view of a stage of a process for forming the structure along lines B-B' shown in FIG. 1C-1, in accordance with some embodiments. As shown in FIGS. 1C-1, 1C-2, and 1C-3, portions of the mask layer 150, the dummy gate strips 142a and 144a, and the gate dielectric layers 132 and 134 are removed, in accordance with some embodiments. The removal process includes a photolithography process and an etching process, in accordance with some embodiments.

The dummy gate strip 142a is cut into dummy gates 142 by the removal process, in accordance with some embodiments. For the sake of simplicity, FIG. 1C-1 only shows one of the dummy gates 142. The dummy gate 142 extends across the active region 111, in accordance with some embodiments.

The dummy gate strip 144a is cut into dummy gates 144 by the removal process, in accordance with some embodiments. Each of the dummy gates 144 is positioned between two adjacent active regions 111 and 111', in accordance with some embodiments. For the sake of simplicity, FIG. 1C-1 only shows one of the dummy gates 144. The dummy gate 144 has a first portion P1 and a second portion P2 spaced apart from each other by a gap B1, in accordance with some embodiments.

The contact area A1 is positioned between the gap B1 and the dummy gate 142, in accordance with some embodiments. The dummy gate 144 further has a third portion P3 spaced apart from the second portion P2 by a gap B2, in accordance with some embodiments. The contact area A2 is positioned between the gap B2 and the dummy gate 142, in accordance with some embodiments.

As shown in FIGS. 1D-1 and 1D-2, lightly doped regions 112 are formed in the semiconductor substrate 110 by using a suitable process, such as an ion implantation process. The ion implantation process may use the dummy gate 142 as a mask, and the lightly doped regions 112 are located at two opposite sides of the dummy gate 142, in accordance with some embodiments. The lightly doped regions 112 may be a lightly doped source region and a lightly doped drain (LDD) region. The dopants used in the ion implantation process may include boron or phosphorous.

As shown in FIGS. 1D-1 and 1D-2, a protective layer 160 is formed over the semiconductor substrate 110 to cover the mask layer 150, the dummy gates 142 and 144, and the gate dielectric layers 132 and 134, in accordance with some embodiments. The protective layer 160 is configured to protect spacers, which are subsequently formed, from damage during a dummy-gate removal process, in accordance with some embodiments. The protective layer 160 includes oxide, in accordance with some embodiments. The protective layer 160 is formed by an atomic layer deposition (ALD) process, a chemical vapor deposition process, or a physical vapor deposition (PVD) process, in accordance with some embodiments.

As shown in FIGS. 1E-1 and 1E-2, portions of the protective layer 160 and the semiconductor substrate 110 are removed to form recesses 114a and 114b at the two opposite sides of the dummy gate 142, in accordance with some embodiments. The recesses 114a and 114b pass through the protective layer 160 and extend into the semiconductor substrate 110, in accordance with some embodiments.

The recess 114b is located between the dummy gates 142 and 144, in accordance with some embodiments. The recesses 114a and 114b are formed by a dry etching process and a wet etching process, in accordance with some embodiments. In some other embodiments (not shown), the recesses 114a and 114b are formed by a dry etching process, in accordance with some embodiments.

As shown in FIGS. 1F-1 and 1F-2, stressors 172 and 174 are formed in the recesses 114a and 114b, respectively, in accordance with some embodiments. In some embodiments, the stressors 172 and 174 include a p-type semiconductor material. For example, the stressors 172 and 174 may include epitaxially grown silicon germanium. In some other embodiments, the stressors 172 and 174 include an n-type semiconductor material. The stressors 172 and 174 may include epitaxially grown silicon, epitaxially grown silicon carbide (SiC), epitaxially grown silicon phosphide (SiP), or another suitable epitaxially grown semiconductor material.

In some embodiments, the stressors 172 and 174 are formed by using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the stressors 172 and 174 may use gaseous and/or liquid precursors, which may interact with the semiconductor substrate 110.

In some embodiments, the stressors 172 and 174 are doped with one or more suitable dopants. For example, the stressors 172 and 174 are p-type source/drain features doped with boron (B) or another suitable dopant. Alternatively, the stressors 172 and 174 are n-type source/drain features doped with phosphor (P), antimony (Sb), or another suitable dopant. In some embodiments, the stressors 172 and 174 are doped in-situ during the growth of the stressors 172 and 174.

In some other embodiments, the stressors 172 and 174 are not doped during the growth of the stressors 172 and 174. After the formation of the stressors 172 and 174, the stressors 172 and 174 are doped in a subsequent process. In some embodiments, the doping is achieved by using an ion implantation process, a plasma immersion ion implantation process, a gas and/or solid source diffusion process, another applicable process, or a combination thereof. In some embodiments, the stressors 172 and 174 are further exposed to annealing processes to activate the dopants. For example, a rapid thermal annealing process is performed.

As shown in FIGS. 1F-1 and 1F-2, semiconductor cap layers 182 and 184 are formed over the stressors 172 and 174, respectively, in accordance with some embodiments. The semiconductor cap layer 182 is formed over a top surface 172a of the stressor 172 exposed by the protective layer 160, in accordance with some embodiments. The semiconductor cap layer 184 is formed over a top surface 174a of the stressor 174 exposed by the protective layer 160 and the isolation structure 120, in accordance with some embodiments.

The semiconductor cap layers 182 and 184 are configured to serve as a reacting subject in a subsequent silicide process, in accordance with some embodiments. The semiconductor cap layers 182 and 184 include pure silicon, in accordance with some embodiments. The semiconductor cap layers 182 and 184 are formed by a selective epitaxy growth process, in accordance with some embodiments.

As shown in FIGS. 1G-1 and 1G-2, a spacer layer 190a is formed over the protective layer 160 to cover the mask layer 150 and the dummy gates 142 and 144, in accordance with some embodiments. The spacer layer 190a includes an insulating material, such as silicon oxide or silicon nitride. The spacer layer 190a is formed using a chemical vapor deposition process, in accordance with some embodiments.

FIG. 1H-3 is a cross-sectional view of a stage of a process for forming the structure along lines B-B' shown in FIG. 1H-1, in accordance with some embodiments. As shown in FIGS. 1H-1, 1H-2, and 1H-3, an anisotropic etching process is performed to remove a portion of the spacer layer 190a, in accordance with some embodiments. The spacer layer 190a remaining over the sidewalls of the first portion 152 of the mask layer 150, the dummy gate 142, and the gate dielectric layer 132 forms a spacer 192, in accordance with some embodiments.

The spacer 192 is configured to electrically isolate a gate formed subsequently from other devices and configured to act as a mask layer in a subsequent silicide process, in accordance with some embodiments. The anisotropic etching process includes a dry etching process, in accordance with some embodiments.

The spacer layer 190a remaining over the sidewalls of the second portion 154 of the mask layer 150, the dummy gate 144, and the gate dielectric layer 134 forms spacers 194, in accordance with some embodiments. In some embodiments, the spacers 194 extend onto the semiconductor cap layer 184 along a sidewall 122 of the isolation structure 120. Since the gap B1 separates the first portion P1 from the second portion P2 of the dummy gate 144 and is formed adjacent to the contact area A1, the spacers 194 do not overlap with the semiconductor cap layer 184 in the contact area A1, in accordance with some embodiments.

Similarly, since the gap B2 separates the second portion P2 from the third portion P3 of the dummy gate 144 and is formed adjacent to the contact area A2, the spacers 194 do not overlap with the semiconductor cap layer 184 in the contact area A2, in accordance with some embodiments. Therefore, the gaps B1 and B2 prevent the spacers 194 from hindering the subsequent silicide process performed over the semiconductor cap layer 184 in the contact areas A1 and A2.

As shown in FIGS. 1I-1 and 1I-2, a silicide process is performed to transfer the semiconductor cap layers 182 and 184 exposed by the spacers 192 and 194 into the metal silicide layers 212 and 214, in accordance with some embodiments. The material of the metal silicide layers 212 and 214 is made of nickel silicide, in accordance with some embodiments.

In some embodiments, the metal silicide layers 212 and 214 are made of a silicide material of a suitable metal material. The suitable metal material includes cobalt (Co), platinum (Pt), titanium (Ti), ytterbium (Yb), molybdenum (Mo), erbium (Er), or combinations thereof, in accordance with some embodiments.

Since the spacers 192 and 194 do not overlap with the contact areas A1, A2, A3, and A4, the semiconductor cap layers 182 and 184 in the contact areas A1, A2, A3, and A4 are transferred into the metal silicide layers 212 and 214 completely, which may reduce the contact resistance, in accordance with some embodiments.

As shown in FIGS. 1J-1 and 1J-2, the mask layer 150 is removed, in accordance with some embodiments. The removal process includes a photolithography process and an etching process, in accordance with some embodiments. The etching process includes a dry etching process or a wet etching process, in accordance with some embodiments.

As shown in FIGS. 1K-1 and 1K-2, a contact etch stop layer 220 is formed over the semiconductor substrate 110 to cover the metal silicide layers 212 and 214, in accordance with some embodiments. The contact etch stop layer 220 includes a dielectric material, in accordance with some embodiments. The contact etch stop layer 220 includes silicon nitride, in accordance with some embodiments.

The contact etch stop layer 220 is formed over the metal silicide layers 212 and 214, the spacers 192 and 194, the dummy gates 142 and 144, and the semiconductor substrate 110, in accordance with some embodiments. In some other embodiments, the contact etch stop layer 220 is not formed.

As shown in FIGS. 1K-1 and 1K-2, an insulating layer 230 is deposited over the contact etch stop layer 220, in accordance with some embodiments. The insulating layer 230 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The insulating layer 230 is deposited using a CVD process, a HDPCVD process, a spin-on process, a sputtering process, or a combination thereof, in accordance with some embodiments.

As shown in FIGS. 1L-1 and 1L-2, a planarization process is performed over the insulating layer 230 until top surfaces of the dummy gates 142 and 144 is exposed, in accordance with some embodiments. The planarization process includes a chemical mechanical polishing (CMP) process, in accordance with some embodiments. After the planarization process is performed, the insulating layer 230 has a substantially planar surface to facilitate subsequent process steps. For the sake of simplicity, the contact etch stop layer 220 is omitted in FIG. 1L-1.

As shown in FIGS. 1M-1 and 1M-2, the dummy gates 142 and 144 are removed, in accordance with some embodiments. The removal process for removing the dummy gates 142 and 144 includes a wet etching process, a dry etching process, or a combination thereof, in accordance with some embodiments. In some embodiments, the gate dielectric layers 132 and 134 are also removed.

After the dummy gate 142 and the gate dielectric layers 132 are removed, an opening 192a surrounded by the spacer 192 is formed, in accordance with some embodiments. The opening 192a is a trench, in accordance with some embodiments. After the dummy gates 144 and the gate dielectric layers 134 are removed, openings 194a respectively surrounded by the spacers 194 are formed, in accordance with some embodiments. For the sake of simplicity, the contact etch stop layer 220 is omitted in FIG. 1M-1.

As shown in FIGS. 1N-1 and 1N-2, a gate dielectric layer 240 is formed to cover a bottom of the opening 192a, in accordance with some embodiments. The gate dielectric layer 240 covers the openings 192a and 194a, top surfaces of the protective layer 160, the spacers 192 and 194, the contact etch stop layer 220, and the insulating layer 230, in accordance with some embodiments.

The gate dielectric layer 240 includes a dielectric material, such as a high dielectric constant (high-k) material. The high-k material includes hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof, in accordance with some embodiments.

The gate dielectric layer 240 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 240 needs to be further annealed.

An intermediate dielectric layer (not shown) may be formed over the semiconductor substrate 110 before the gate dielectric layer 240 is formed. The intermediate dielectric layer includes a suitable dielectric material, such as silicon oxide, hafnium silicate, silicon oxynitride, or combinations thereof.

As shown in FIGS. 1N-1 and 1N-2, a work function metal layer 250 is deposited over the gate dielectric layer 240, in accordance with some embodiments. The work function metal layer 250 provides a desired work function for transistors to enhance device performance including improved threshold voltage.

In the embodiments of forming a PMOS transistor, the work function metal layer 250 can be a p-type metal capable of providing a work function value suitable for the device, such as equal to or greater than about 4.8 eV. The p-type metal includes metal, metal carbide, metal nitride, other suitable materials, or combinations thereof, in accordance with some embodiments. For example, the p-type metal is made of titanium, titanium nitride, other suitable materials, or combinations thereof.

On the other hand, in the embodiments of forming an NMOS transistor, the work function metal layer 250 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

The work function metal layer 250 is made of hafnium, zirconium, titanium, tantalum, aluminum, metal carbide (e.g., hafnium carbide, or zirconium carbide), aluminide, ruthenium or combinations thereof, in accordance with some embodiments. The work function metal layer 250 is deposited using a PVD process, CVD process, ALD process, plating process, another suitable method, or combinations thereof, in accordance with some embodiments.

As shown in FIGS. 1N-1 and 1N-2, a gate electrode layer 260 (also called a metal gate electrode layer) is deposited over the work function metal layer 250 to fill the openings 192a and 194*a*, in accordance with some embodiments. The gate electrode layer 260 includes a suitable metal material, such as aluminum, tungsten, gold, platinum, cobalt, another suitable metal, an alloy thereof, or combinations thereof, in accordance with some embodiments. The gate electrode layer 260 is deposited using a PVD process, a CVD process, a plating process, the like, or combinations thereof, in accordance with some embodiments.

As shown in FIGS. 1O-1 and 1O-2, a planarization process is performed to remove the gate electrode layer 260, the work function metal layer 250, and the gate dielectric layer 240 outside of the openings 192*a* and 194*a*, in accordance with some embodiments. The planarization process includes a chemical mechanical polishing (CMP) process or the like, in accordance with some embodiments.

The gate electrode layer 260, the work function metal layer 250, and the gate dielectric layer 240 in the opening 192*a* together form a gate stack G (i.e., a metal gate stack). The spacer 192 is formed over a sidewall S1 of the gate stack G, in accordance with some embodiments. The gate electrode layer 260 remaining in the opening 192*a* serves as a metal gate electrode of the gate stack G, in accordance with some embodiments.

The gate electrode layer 260, the work function metal layer 250, and the gate dielectric layer 240 in the openings 194*a* together form a dummy gate stack D (i.e., a metal gate stack). The dummy gate stack D has a first portion DP1 and a second portion DP2 spaced apart from each other by a gap GA1, in accordance with some embodiments. The dummy gate stack D further has a third portion DP3 spaced apart from the second portion DP2 by a gap GA2, in accordance with some embodiments. The spacers 194 are formed over sidewalls S2 of the first portion DP1, the second portion DP2, and the third portion DP3, respectively, in accordance with some embodiments. For the sake of simplicity, the contact etch stop layer 220 is omitted in FIG. 1O-1.

As shown in FIGS. 1P-1 and 1P-2, an etching stop layer 270 (also called an insulating layer or a dielectric layer) is deposited over the top surfaces of the insulating layer 230, the contact etch stop layer 220, the spacers 192 and 194, the protective layer 160, the work function metal layer 250, and the gate electrode layer 260, in accordance with some embodiments. The etching stop layer 270 is made of silicon nitride, in accordance with some embodiments.

As shown in FIGS. 1P-1 and 1P-2, a protective layer 280 is formed over the etching stop layer 270, in accordance with some embodiments. The protective layer 280 includes a plasma-enhanced oxide (PEOX) layer, in accordance with some embodiments.

As shown in FIGS. 1Q-1 and 1Q-2, portions of the protective layer 280, the etching stop layer 270, the insulating layer 230, and the contact etch stop layer 220 are removed to form contact openings 292, 294, 296, and 298, in accordance with some embodiments. The contact openings 292, 294, 296, and 298 pass through the protective layer 280, the etching stop layer 270, the insulating layer 230, and the contact etch stop layer 220, in accordance with some embodiments.

The openings 292 and 294 expose the metal silicide layer 214 in the contact areas A1 and A2, in accordance with some embodiments. The openings 296 and 298 expose the metal silicide layer 212 in the contact areas A3 and A4, in accordance with some embodiments. The removal process includes performing a photolithography process and an etching process, in accordance with some embodiments.

As shown in FIGS. 1R-1 and 1R-2, a conductive layer 310 is deposited over the protective layer 280 and is filled into the openings 292, 294, 296, and 298 to electrically contact with the metal silicide layers 212 and 214, in accordance with some embodiments. The conductive layer 310 is formed by, for example, a PVD process or other suitable processes. The conductive layer 310 is made of, for example, tungsten or other suitable conductive materials.

FIG. 1S-3 is a cross-sectional view of a stage of a process for forming the structure along lines B-B' shown in FIG. 1S-1, in accordance with some embodiments. As shown in FIGS. 1S-1, 1S-2, and 1S-3, a planarization process is performed to remove the conductive layer 310 outside the openings 292, 294, 296, and 298, and the protective layer 280, in accordance with some embodiments. For the sake of simplicity, the contact etch stop layer 220, the insulating layer 230, and the etching stop layer 270 are omitted in FIG. 1S-1.

The planarization process includes a chemical mechanical polishing (CMP) process, in accordance with some embodiments. After the CMP process, the conductive layer 310 remaining in the openings 292 and 294 forms contact structures 322 and 324 electrically connecting the metal silicide layer 214 and the stressor 174 (i.e. the S/D feature), in accordance with some embodiments. The contact structures 322 and 324 are positioned between the gate stack G and the isolation structure 120, in accordance with some embodiments.

After the CMP process, the conductive layer 310 remaining in the openings 296 and 298 forms contact structures 326 and 328 electrically connecting the metal silicide layer 212 and the stressor 172 (i.e. the S/D feature), in accordance with some embodiments. The contact structures 322, 324, 326 and 328 include contact plugs, in accordance with some embodiments.

As shown in FIGS. 1S-1, 1S-2, and 1S-3, a semiconductor device structure 300 is formed. The semiconductor device 300 is an n-type metal-oxide-semiconductor field-effect transistor (MOSFET) or a p-type MOSFET, in accordance with some embodiments.

In the semiconductor device 300, the dummy gate stack D is adjacent to the gate stack G, in accordance with some embodiments. The dummy gate stack D is not formed over portions 122 and 124 of the isolation structure 120 next to the contact structures 322 and 324, in accordance with some embodiments. The contact structure 322 is positioned between the portion 122 and the gate stack G, in accordance with some embodiments. The contact structure 324 is positioned between the portion 124 and the gate stack G, in accordance with some embodiments.

The gap GA1 separates the first portion DP1 from the second portion DP2 of the dummy gate stack D, and the contact structure 322 is located between the gap GA1 and the gate stack G, in accordance with some embodiments.

Therefore, the gap GA1 prevents the contact structure 322 from overlapping with the spacers 194, which are formed over the sidewalls S2 of the first portion DP1 and the second portion DP2. That is, the gap GA1 prevents the spacers 194 from extending between the contact structure 322 and the metal silicide layer 214. In some embodiments, the spacers 194 are spaced apart from the contact structure 322.

As a result, the contact structure 322 is connected with the metal silicide layer 214. The metal silicide layer 214 is in direct contact with most of a bottom surface 322*a* of the contact structure 322, which may reduce the contact resistance, in accordance with some embodiments. In some embodiments, the metal silicide layer 214 is in direct contact with substantially the entire bottom surface 322*a* of the contact structure 322. The metal silicide layer 214 is in direct contact with the isolation structure 120, in accordance with some embodiments.

As shown in FIG. 1S-1, the gap GA1 has a length L1, the contact structure 322 has a length L2, and the active region 111 has a length L3. The length L1 is greater than the length L2, in accordance with some embodiments. A ratio of the length L1 of the gap GA1 to the length L2 of the contact structure 322 ranges from about 1.5 to about 20, in accordance with some embodiments. The length L1 of the gap GA1 is less than the length L3 of the active region 111, in accordance with some embodiments.

The stressors 172 and 174 are positioned in the active region 111 and at two opposite sides of the gate stack G, in accordance with some embodiments. The stressor 174 is positioned between the gate stack G and the dummy gate stack D, in accordance with some embodiments.

Figures 1, 2A:
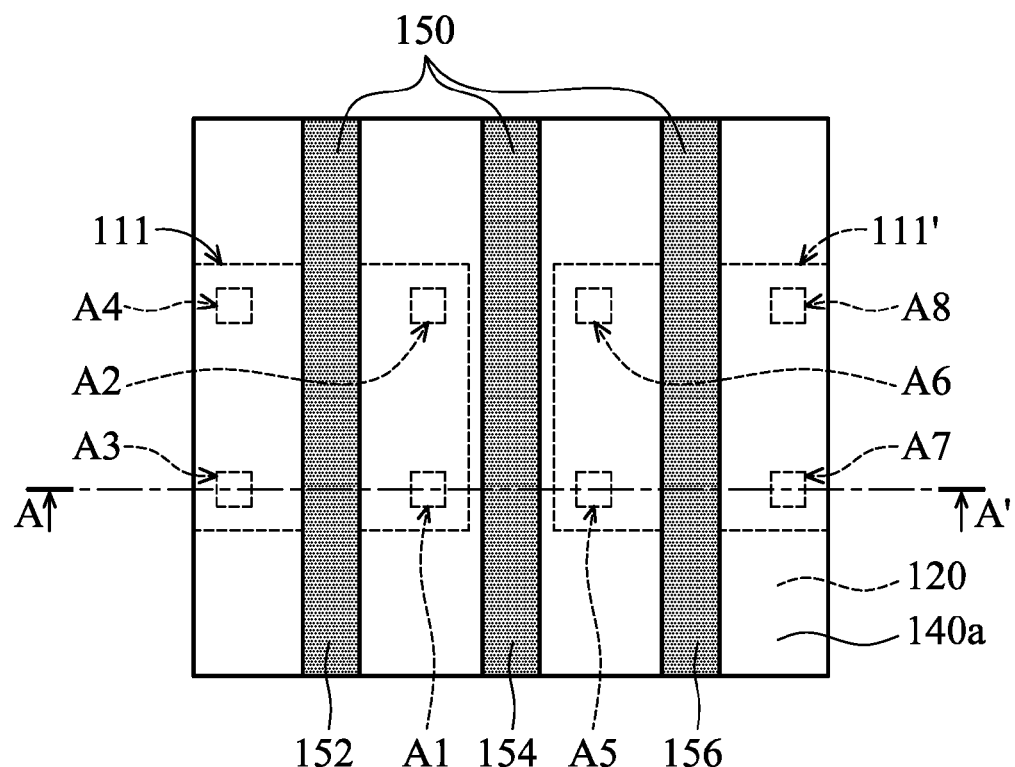
Figures 2, 2A:
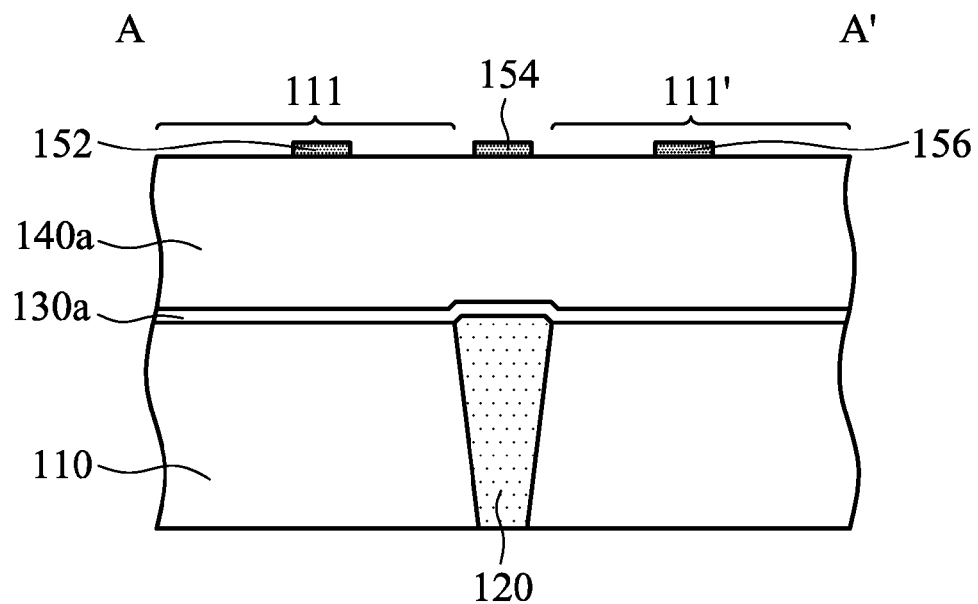
Figures 1, 2B:
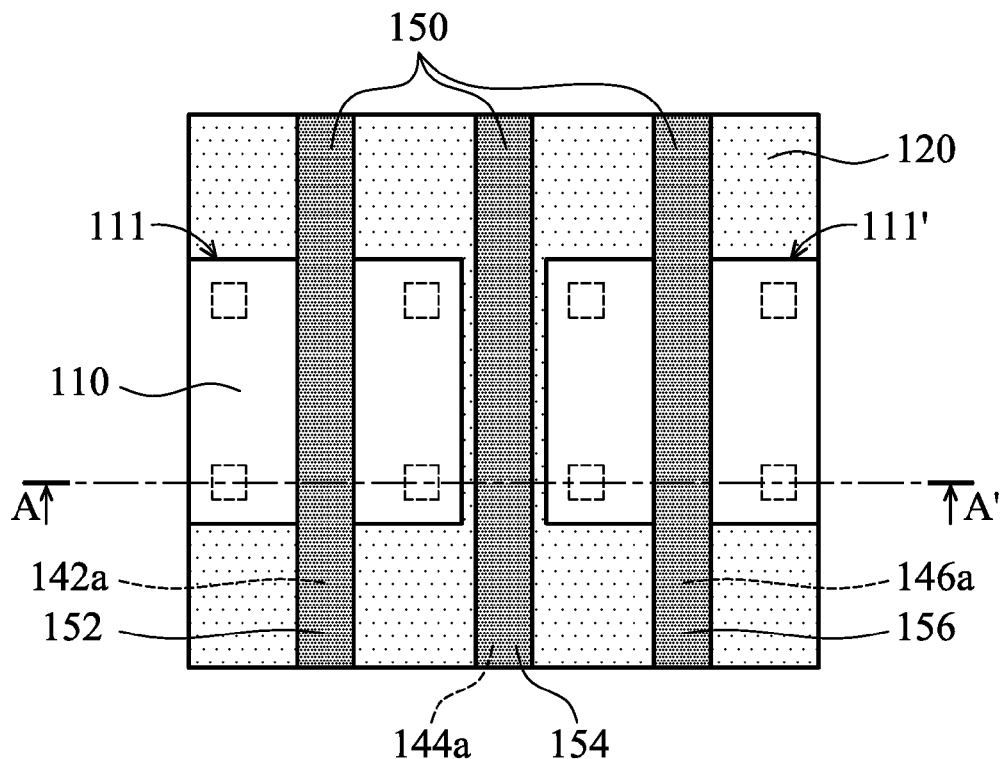
Figures 2, 2B:
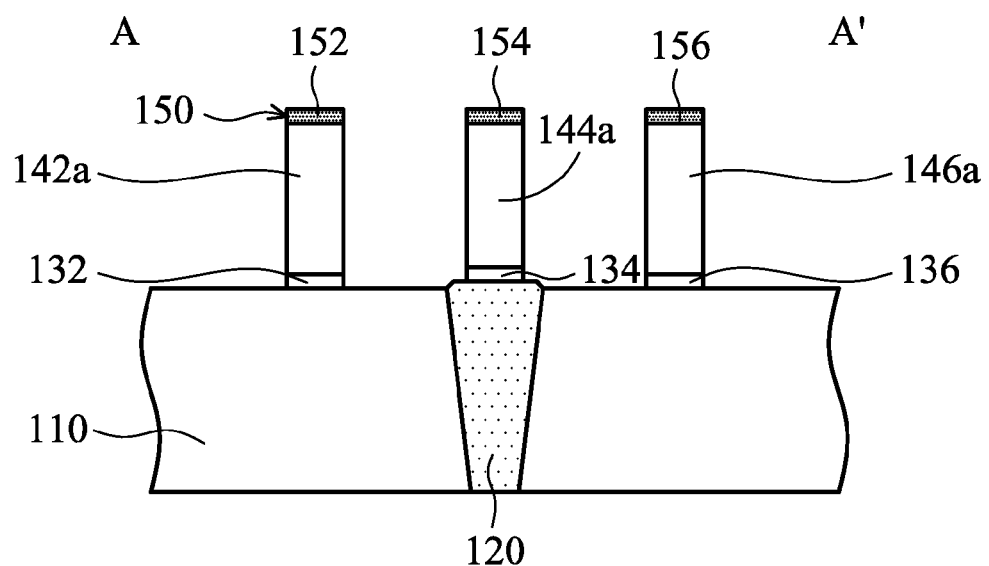
Figures 1, 2C:
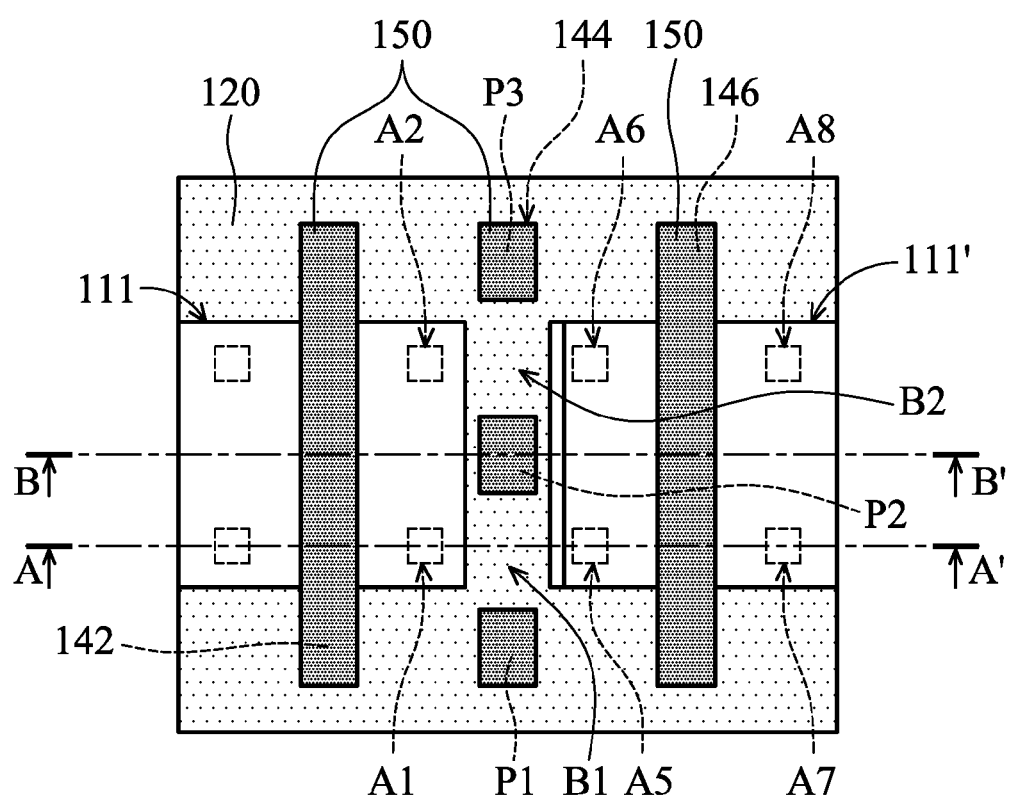
Figures 2, 2C:
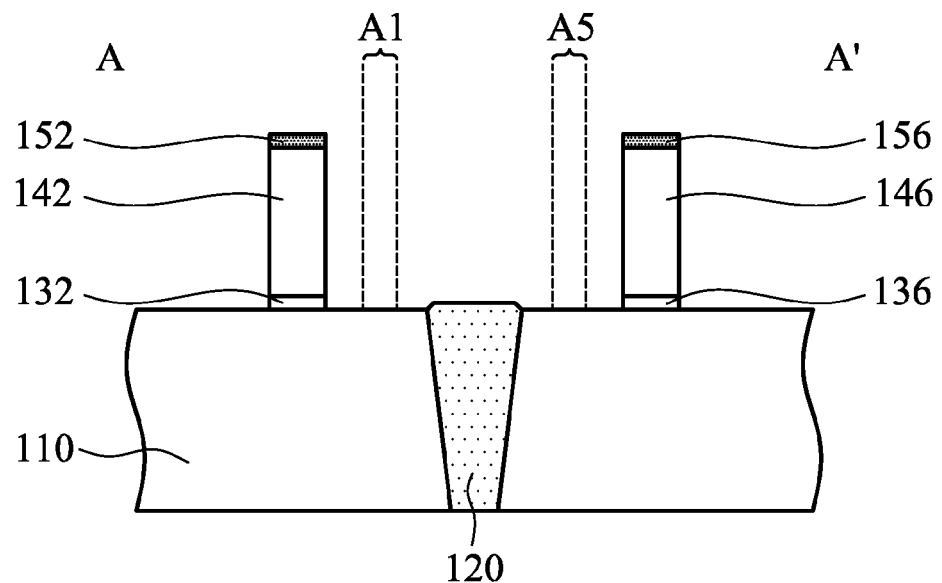
Figures 2, 2C, 3:
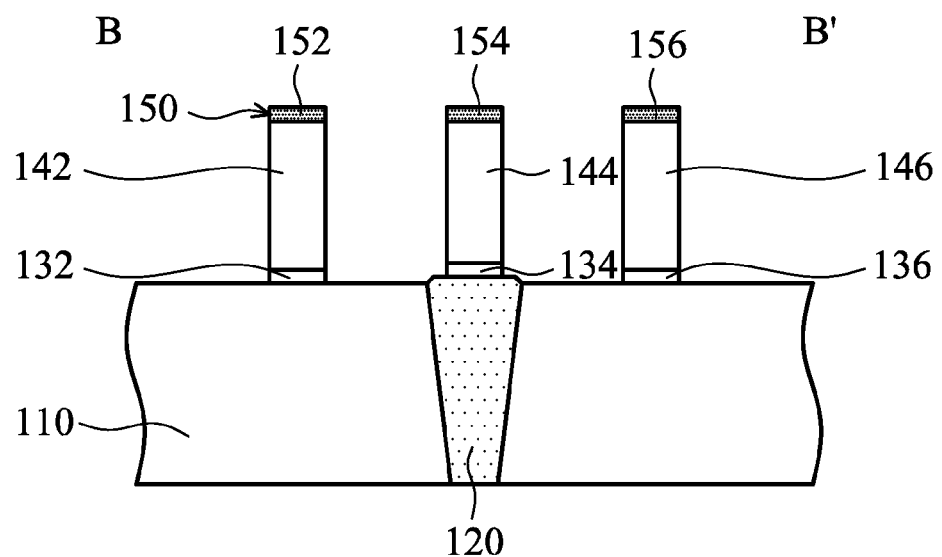
Figures 1, 2D:
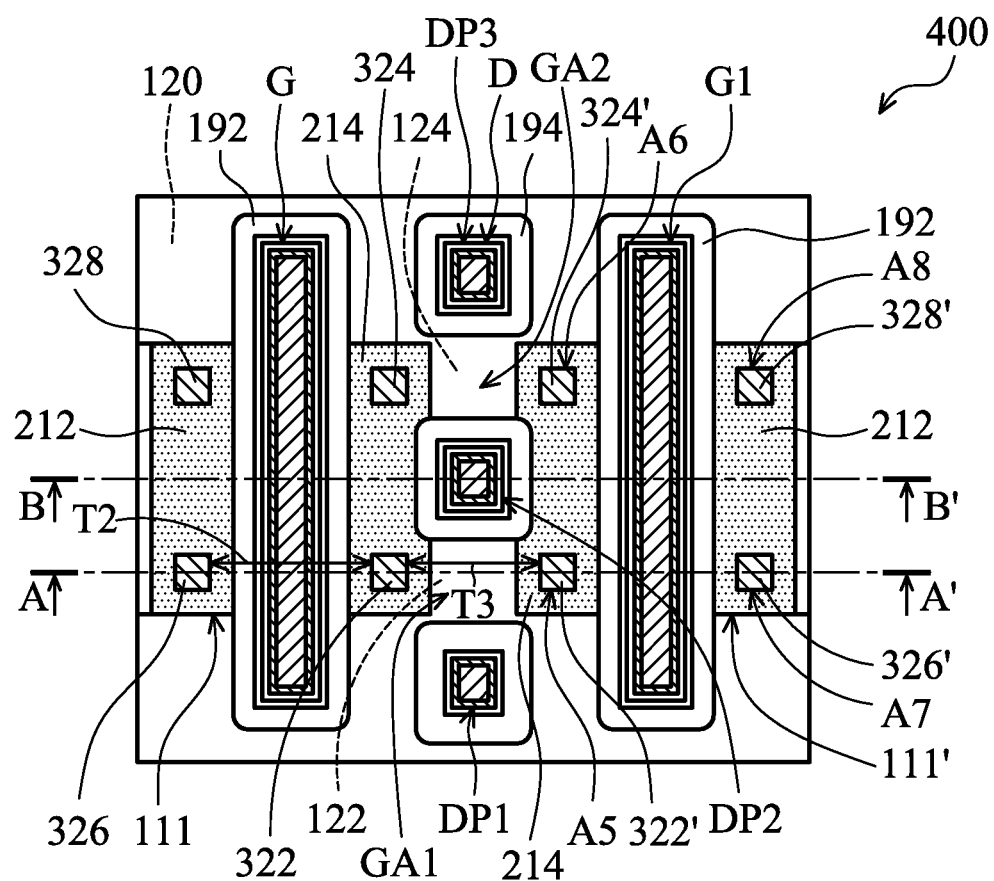
Figures 2, 2D:
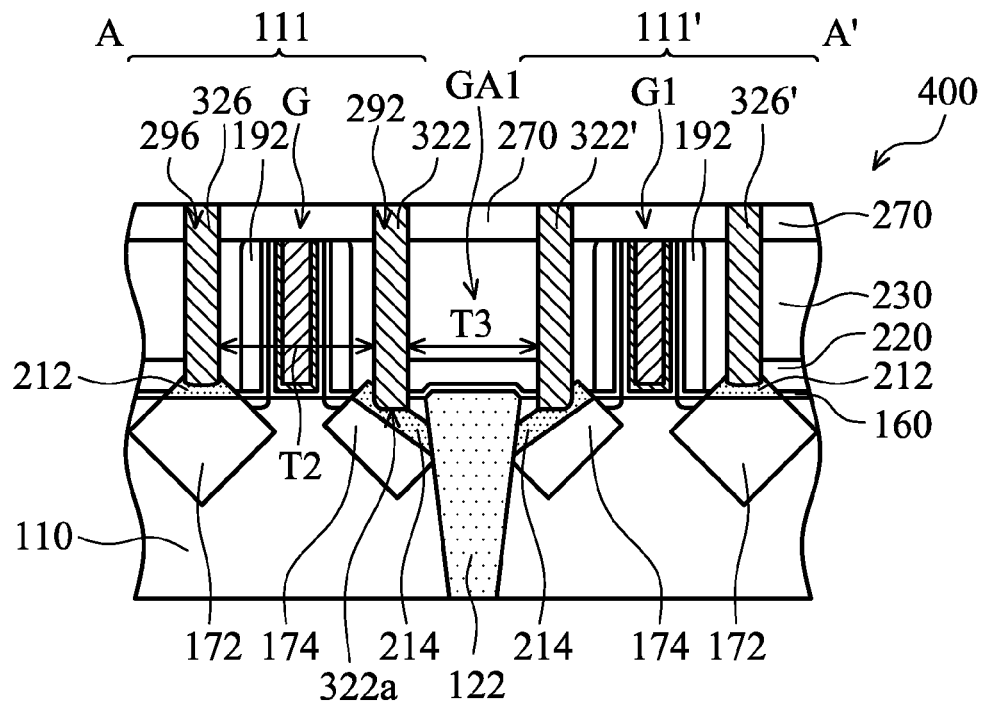
Figures 2, 2D, 3:
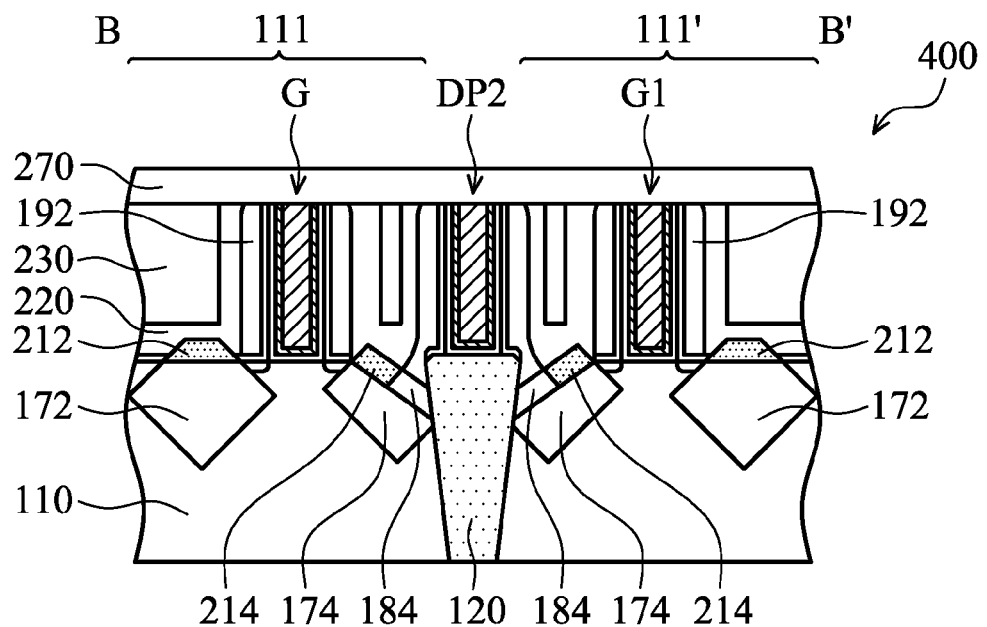

FIGS. 2A-1 to 2D-1 are top views of various stages of a process for forming a semiconductor device structure 400, in accordance with some embodiments. FIGS. 2A-2 to 2D-2 are cross-sectional views of various stages of a process for forming the semiconductor device structure 400 along lines A-A' shown in FIGS. 2A-1 to 2D-1, in accordance with some embodiments. FIG. 2C-3 to 2D-3 are cross-sectional views of various stages of a process for forming the semiconductor device structure 400 along lines B-B' shown in FIGS. 2C-1 to 2D-1, in accordance with some embodiments.

It should be noted that the embodiment of FIGS. 2A-1 to 2D-1 is similar to the embodiment of FIGS. 1A-1 to 1S-1, except that the embodiment of FIGS. 2A-1 to 2D-1 further depicts structures formed in the active region 111'. Therefore, the detailed descriptions of the elements formed outside of the active region 111' are not repeated herein.

As shown in FIGS. 2A-1 and 2A-2, the active region 111' has contact areas A5, A6, A7, and A8 where contact structures will be formed in subsequent processes, in accordance with some embodiments. The mask layer 150 further includes a third portion 156 spaced apart from the first portion 152 and the second portion 154, in accordance with some embodiments. The third portion 156 extends across the active region 111', in accordance with some embodiments.

As shown in FIGS. 2B-1 and 2B-2, the dummy gate material layer 140a exposed by the mask layer 150 is removed, and the gate dielectric material layer 130a under the removed dummy gate material layer 140a is also removed, in accordance with some embodiments.

The dummy gate material layer 140a remaining under the third portion 156 forms a dummy gate strip 146a, in accordance with some embodiments. The dummy gate strip 146a extends across the active region 111' and other active regions (not shown), in accordance with some embodiments. The gate dielectric material layer 130a remaining under the dummy gate strip 146a forms a gate dielectric layer 136, in accordance with some embodiments.

As shown in FIGS. 2C-1, 2C-2, and 2C-3, portions of the mask layer 150, the dummy gate strips 142a, 144a, and 146a and the gate dielectric layers 132, 134, and 136 are removed, in accordance with some embodiments. The dummy gate strip 146a is cut into dummy gates 146 by the removal process, in accordance with some embodiments. For the sake of simplicity, FIG. 2C-1 only shows one of the dummy gates 146. The dummy gate 146 extends across the active region 111', in accordance with some embodiments.

The dummy gate strip 144a is cut into dummy gates 144 by the removal process, in accordance with some embodiments. The dummy gate 144 has a first portion P1 and a second portion P2 spaced apart from each other by a gap B1, in accordance with some embodiments. The gap B1 is positioned between the contact areas A1 and A5, in accordance with some embodiments. That is, there is no dummy gate positioned between the contact areas A1 and A5, in accordance with some embodiments.

The dummy gate 144 further has a third portion P3 spaced apart from the second portion P2 by a gap B2, in accordance with some embodiments. The gap B2 is positioned between the contact areas A2 and A6, in accordance with some embodiments. That is, there is no dummy gate positioned between the contact areas A2 and A6, in accordance with some embodiments.

After the stages of FIGS. 1D-1 to 1R-1, as shown in FIGS. 2D-1, 2D-2, and 2D-3, contact structures 322', 324', 326', and 328', a gate stack G1, a spacer 192, metal silicide layers 212 and 214, stressors 172 and 174 are formed in/over the active region 111', in accordance with some embodiments.

As shown in FIGS. 2D-1, 2D-2, and 2D-3, a semiconductor device structure 400 is formed. In the semiconductor device 400, there is no dummy gate stack positioned between the contact structures 322 and 322', in accordance with some embodiments. The dummy gate stack D is not formed over a portion 122 of the isolation structure 120, and the portion 122 is between the contact structures 322 and 322', in accordance with some embodiments.

There is no dummy gate stack positioned between the contact structures 324 and 324', in accordance with some embodiments. The dummy gate stack D is not formed over a portion 124 of the isolation structure 120, and the portion 124 is between the contact structures 324 and 324', in accordance with some embodiments.

The dummy gate stack D has a first portion DP1 and a second portion DP2 spaced apart from each other by a gap GA1, in accordance with some embodiments. The gap GA1 is positioned between the contact structures 322 and 322', in accordance with some embodiments.

The dummy gate stack D further has a third portion DP3 spaced apart from the second portion DP2 by a gap GA2, in accordance with some embodiments. The gap GA2 is positioned between the contact structures 324 and 324', in accordance with some embodiments.

A distance T2 between the contact structures 322 and 326 ranges from about 0.09 μm to about 18 μm, in accordance with some embodiments. The distance T2 between the contact structures 322 and 326 ranges from about 0.09 μm to about 3 μm, in accordance with some embodiments.

A distance T3 between the contact structures 322 and 322' ranges from about 0.08 μm to about 10 μm, in accordance with some embodiments. The distance T3 between the contact structures 322 and 322' ranges from about 0.09 μm to about 0.21 μm, in accordance with some embodiments.

In accordance with some embodiments, semiconductor device structures and methods for forming the same are provided. The methods (for forming the semiconductor device structure) form a dummy gate stack over an isolation structure, and the dummy gate stack is adjacent to a gate stack over an active region. The dummy gate stack is not formed over a portion of the isolation structure next to a contact structure, which is formed over the active region. Therefore, spacers formed over the dummy gate stack are prevented from extending under the contact structure, which may reduce the contact resistance.

In accordance with some embodiments, a semiconductor device structure is provided. The semiconductor device structure includes a semiconductor substrate. The semiconductor device structure includes an isolation structure positioned in the semiconductor substrate and adjacent to a first active region of the semiconductor substrate. The semiconductor device structure includes a gate stack disposed over the first active region. The semiconductor device structure includes a first contact structure disposed over the first active region and positioned between the isolation structure and the gate stack. The semiconductor device structure includes a dummy gate stack disposed over the isolation structure and adjacent to the gate stack. The dummy gate stack is not positioned over a portion of the isolation structure next to the first contact structure.

In accordance with some embodiments, a semiconductor device structure is provided. The semiconductor device structure includes a semiconductor substrate. The semiconductor device structure includes an isolation structure positioned in the semiconductor substrate and surrounding a first active region of the semiconductor substrate. The semiconductor device structure includes a gate stack disposed over the first active region. The semiconductor device structure includes a dummy gate stack disposed over the isolation structure and adjacent to the gate stack. The dummy gate stack has a first portion and a second portion spaced apart from each other by a gap. The semiconductor device structure includes a first contact structure disposed over the first active region and positioned between the gap and the gate stack. The gap has a first length greater than a second length of the first contact structure.

In accordance with some embodiments, a method for forming a semiconductor device structure is provided. The method includes forming a gate stack over a first active region of a semiconductor substrate. An isolation structure is formed in the semiconductor substrate and adjacent to the first active region. The method includes forming a dummy gate stack over the isolation structure and adjacent to the gate stack. The dummy gate stack is not formed over a portion of the isolation structure. The method includes forming a first contact structure over the first active region and between the portion of the isolation structure and the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
an isolation structure positioned in the semiconductor substrate and adjacent to a first active region of the semiconductor substrate;
a gate stack disposed over the first active region;
a first contact structure disposed over the first active region and positioned between the gate stack and the isolation structure; and
a dummy gate stack disposed over the isolation structure and adjacent to the gate stack, wherein the dummy gate stack is not positioned over a portion of the isolation structure next to the first contact structure such that only one of the dummy gate stack and the first contact structure is present in a cross-sectional view of the semiconductor device structure, and wherein the cross-sectional view of the semiconductor device structure is taken along an imaginary plane that is parallel to a normal direction of a top surface of the semiconductor substrate and perpendicular to a longitudinal direction of the gate stack.

2. The semiconductor device structure as claimed in claim 1, wherein the dummy gate stack has a first portion and a second portion spaced apart from each other by a gap, and the first contact structure is positioned between the gap and the gate stack.

3. The semiconductor device structure as claimed in claim 2, wherein a ratio of a first length of the gap to a second length of the first contact structure ranges from about 1.5 to about 20.

4. The semiconductor device structure as claimed in claim 2, wherein the first length of the gap is less than a third length of the first active region.

5. The semiconductor device structure as claimed in claim 1, wherein the semiconductor substrate further has a second active region, the isolation structure separates the first active region from the second active region, the semiconductor device structure further comprises a second contact structure disposed over the second active region, and there is no dummy gate stack positioned between the first contact structure and the second contact structure.

6. The semiconductor device structure as claimed in claim 1, further comprising:
a first stressor and a second stressor positioned in the first active region and at two opposite sides of the gate stack, wherein the second stressor is positioned between the gate stack and the dummy gate stack.

7. The semiconductor device structure as claimed in claim 6, further comprising:
a metal silicide layer positioned over the first stressor and the second stressor, wherein the first contact structure is connected with the metal silicide layer over the second stressor.

8. The semiconductor device structure as claimed in claim 7, wherein the metal silicide layer is in direct contact with the isolation structure.

9. A semiconductor device structure, comprising:
a semiconductor substrate;
an isolation structure positioned in the semiconductor substrate and adjacent to a first active region of the semiconductor substrate;
a gate stack disposed over the first active region;
a dummy gate stack disposed over the isolation structure and adjacent to the gate stack, wherein the dummy gate stack has a first portion and a second portion spaced apart from each other by a gap; and
a first contact structure disposed over the first active region and positioned between the gap and the gate stack, wherein a length of the gap along a longitudinal direction of the gate stack is greater than a length of the first contact structure along the longitudinal direction of the gate stack,
wherein the first contact structure, the first portion of the dummy gate stack and the second portion of the dummy gate stack are located on a same side of the gate stack.

10. The semiconductor device structure as claimed in claim 9, further comprising:
a first stressor and a second stressor positioned in the first active region and at two opposite sides of the gate stack, wherein the second stressor is positioned between the gate stack and the dummy gate stack.

11. The semiconductor device structure as claimed in claim 10, further comprising:
a metal silicide layer positioned over the first stressor and the second stressor.

12. The semiconductor device structure as claimed in claim 11, wherein the first contact structure is connected with the metal silicide layer over the second stressor.

13. The semiconductor device structure as claimed in claim 9, wherein the semiconductor substrate further has a second active region, the isolation structure separates the first active region from the second active region, the semiconductor device structure further comprises a second contact structure disposed over the second active region, and the gap is positioned between the first contact structure and the second contact structure.

14. The semiconductor device structure as claimed in claim 9, further comprising:
- a first spacer positioned over a first sidewall of the gate stack; and
- second spacers positioned over second sidewalls of the first portion and the second portion of the dummy gate stack, respectively.

15. The semiconductor device structure as claimed in claim 14, wherein the second spacers are spaced apart from the first contact structure.

16. A method for forming a semiconductor device structure, comprising:
- forming a gate stack over a first active region of a semiconductor substrate, wherein an isolation structure is formed in the semiconductor substrate and adjacent to the first active region;
- forming a dummy gate stack over the isolation structure and adjacent to the gate stack, wherein the dummy gate stack is not formed over a portion of the isolation structure; and
- forming a first contact structure over the first active region and between the portion of the isolation structure and the gate stack such that only one of the dummy gate stack and the first contact structure is present in a cross-sectional view of the semiconductor device structure, and wherein the cross-sectional view of the semiconductor device structure is taken along an imaginary plane that is parallel to a normal direction of a top surface of the semiconductor substrate and perpendicular to a longitudinal direction of the gate stack.

17. The method for forming a semiconductor device structure as claimed in claim 16, further comprising:
- before the formation of the first contact structure, forming a first stressor and a second stressor in the first active region, wherein the first stressor and the second stressor are positioned at two opposite sides of the gate stack, and the second stressor is positioned between the gate stack and the dummy gate stack.

18. The method for forming a semiconductor device structure as claimed in claim 17, further comprising:
- after the formation of the first stressor and the second stressor and before the formation of the first contact structure, forming a metal silicide layer over the first stressor and the second stressor.

19. The method for forming a semiconductor device structure as claimed in claim 17, wherein the formation the first stressor and the second stressor comprises:
- forming a first recess and a second recess in the first active region; and
- performing an epitaxy process to form a semiconductor material in the first recess and the second recess.

20. The method for forming a semiconductor device structure as claimed in claim 16, wherein the semiconductor substrate further has a second active region separated from the first active region by the isolation structure, and the method further comprises:
- after the formation of the dummy gate stack, forming a second contact structure over the second active region, wherein the portion of the isolation structure is positioned between the second contact structure and the first contact structure.

\* \* \* \* \*